US011006526B2

(12) United States Patent (10) Patent No.: US 11,006,526 B2
Kumagai et al. (45) Date of Patent: May 11, 2021

(54) SEMICONDUCTOR STORAGE DEVICE

(71) Applicant: Toshiba Memory Corporation, Minato-ku (JP)

(72) Inventors: Kengo Kumagai, Yokohama (JP); Daigo Tanuma, Kunitachi (JP); Masahiro Mizuno, Yokohama (JP)

(73) Assignee: Toshiba Memory Corporation, Minato-ku (JP)

(*) Notice: Subject to any disclaimer, the term of this patent is extended or adjusted under 35 U.S.C. 154(b) by 45 days.

(21) Appl. No.: 16/297,182

(22) Filed: Mar. 8, 2019

(65) Prior Publication Data

US 2019/0387628 A1 Dec. 19, 2019

(30) Foreign Application Priority Data

Jun. 19, 2018 (JP) .............................. JP2018-116469

(51) Int. Cl.
*H05K 7/10* (2006.01)
*H05K 7/12* (2006.01)
(Continued)

(52) U.S. Cl.
CPC ............. *H05K 1/181* (2013.01); *G11C 5/141* (2013.01); *G11C 14/0018* (2013.01); (Continued)

(58) Field of Classification Search
CPC .................. H05K 1/181; H05K 1/111; H05K 2201/10636; H05K 2201/10159; H05K 2201/10015; H05K 2201/10522; G11C 5/141; G11C 14/0018; G11C 2207/105; G11C 5/04; H01L 23/642; H01L 23/488; H01L 23/49805; H01L 23/49838; H01G 4/228
See application file for complete search history.

(56) References Cited

U.S. PATENT DOCUMENTS 5,303,122 A * 4/1994 Adams, Jr. ........... H05K 1/0295
174/261
5,683,788 A * 11/1997 Dugan ................. H05K 1/0295
174/261
(Continued)

FOREIGN PATENT DOCUMENTS

JP 2001-308503 11/2001
JP 2003-243814 8/2003
TW 200715927 A 4/2007

*Primary Examiner* — Yuriy Semenenko
(74) *Attorney, Agent, or Firm* — Oblon, McClelland, Maier & Neustadt, L.L.P.

(57) ABSTRACT

According to one embodiment, a semiconductor storage device includes a board, a semiconductor memory component, and a capacitor. The board includes a first pad and a second pad. The first capacitor includes a first electrode and a second electrode. The first pad includes a first region and a second region. A direction from the first pad to the second pad is a first direction and a direction different from the first direction is a second direction. A difference between a dimension of the second region in the second direction and a dimension of the first electrode in the second direction is smaller than a difference between a dimension of the first region in the second direction and a dimension of the first electrode in the second direction.

12 Claims, 12 Drawing Sheets

(51) Int. Cl.
  *H05K 1/18*   (2006.01)
  *H05K 1/11*   (2006.01)
  *G11C 5/14*   (2006.01)
  *G11C 14/00*  (2006.01)

(52) U.S. Cl.
  CPC .... *H05K 1/111* (2013.01); *H05K 2201/10015* (2013.01); *H05K 2201/10159* (2013.01); *H05K 2201/10522* (2013.01); *H05K 2201/10636* (2013.01)

(56) References Cited

U.S. PATENT DOCUMENTS

| | | | |
|---|---|---|---|
| 7,186,926 B2* | 3/2007 | Maeno | H05K 1/111 |
| | | | 174/260 |
| 7,872,874 B2* | 1/2011 | Karasawa | H05K 1/111 |
| | | | 361/767 |
| 7,916,495 B2* | 3/2011 | Huang | H05K 3/3442 |
| | | | 361/767 |
| 9,095,066 B2* | 7/2015 | Kusumoto | H05K 1/111 |
| 10,470,294 B2* | 11/2019 | Welsh | H05K 1/0231 |
| 2011/0063790 A1* | 3/2011 | Park | H05K 1/0239 |
| | | | 361/679.31 |
| 2017/0184278 A1* | 6/2017 | Kamada | F21V 23/06 |
| 2017/0185335 A1 | 6/2017 | Pardoe | |

* cited by examiner

SEMICONDUCTOR STORAGE DEVICE

CROSS-REFERENCE TO RELATED APPLICATION

This application is based upon and claims the benefit of priority from Japanese Patent Application No. 2018-116469, filed Jun. 19, 2018; the entire contents of which are incorporated herein by reference.

FIELD

Embodiments described herein relate generally to a semiconductor storage device.

BACKGROUND

A semiconductor storage device including a board, a semiconductor memory component, and a capacitor is known.

DETAILED DESCRIPTION

Figure 1:
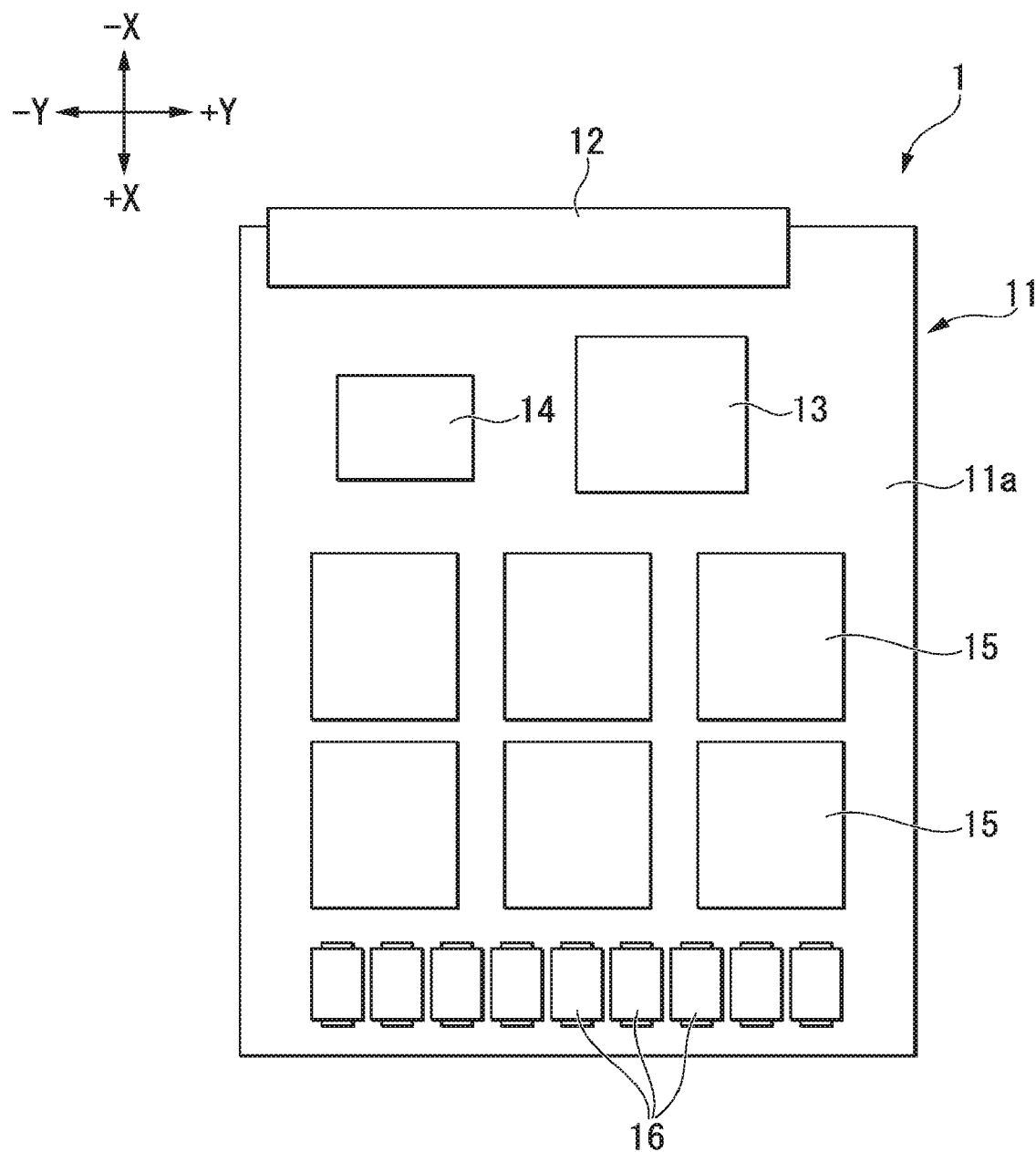
FIG. 1 is a plan view showing a semiconductor storage device according to a first embodiment.

In general, according to one embodiment, a semiconductor storage device includes a board, a semiconductor memory component, and a capacitor. The board includes a first pad and a second pad. The semiconductor memory component is mounted on the board. The first capacitor includes a first electrode and a second electrode. The first electrode is fixed to the first pad. The second electrode is fixed to the second pad. The first pad includes a first region and a second region. The second region is closer to the second pad than the first region. A direction from the first pad to the second pad is a first direction and a direction different from the first direction is a second direction. A difference between a dimension of the second region in the second direction and a dimension of the first electrode in the second direction is smaller than a difference between a dimension of the first region in the second direction and a dimension of the first electrode in the second direction. The first electrode is disposed over at least a part of the first region and at least a part of the second region.

Hereinafter, semiconductor storage devices according to embodiments will be described with reference to the accompanying drawings. Note that, in the following descriptions, components having the same or similar functions are denoted by the same reference numerals and signs. In addition, repeated descriptions thereof may be omitted. In the present specification, expressions of "bottom surface" and "rear surface" may be used. However, these expressions are used for convenience of description and do not specify the direction of gravity in a semiconductor storage device. Further, in the present specification, the term "overlapping" means that virtual projection images of two objects overlap each other, and also includes a case where two objects are not directly in contact with each other. In addition, the term "overlapping" also includes a case of at least partial overlapping. Further, in the present specification, the term "width" means a distance between two edges (or boundaries) and is not limited to the meaning of "width in the lateral direction." For this reason, the term "width" may be read as "dimension." In the present specification, a size or a width being "substantially the same" means that, for example, a difference in size or width between two objects to be compared with each other is 1/10 or less of either the size or the width of any one of the compared objects.

In addition, first, a +X direction, a −X direction, a +Y direction, a −Y direction, a +Z direction, and a −Z direction will be defined. The +X direction, the −X direction, the +Y direction, and the −Y direction are directions along a first surface 11a of a board 11 to be described later. The +X direction is a direction from a first pad 51 provided on the board 11 to a second pad 52 provided on the board 11 (see FIG. 4). The +X direction is an example of a "first direction." The −X direction is a direction opposite to the +X direction. The +X direction and the −X direction will be simply referred to as an "X direction" in a case where the directions are not distinguished from each other. The +Y direction and the −Y direction are directions intersecting (for example, substantially perpendicular to) the X direction. The +Y direction is an example of a "second direction." The +Y direction is a direction from a third edge 51c to a fourth edge 51d of the pad 51 (see FIG. 4). The −Y direction is a direction opposite to the +Y direction. The +Y direction and the −Y direction will be simply referred to as a "Y direction" in a case where the directions are not distinguished from each other. The +Z direction and the −Z direction are directions intersecting (for example, substantially perpendicular to) the X direction and the Y direction and are, for example, thickness directions of the board 11. The +Z direction is a direction from a second surface 11b to the first surface 11a of the board 11 (see FIG. 6). The −Z direction is a direction opposite to the +Z direction. The +Z direction and the −Z direction will be simply referred to as a "Z direction" in a case where the directions are not distinguished from each other.

(First Embodiment)

A semiconductor storage device 1 according to a first embodiment will be described with reference to FIGS. 1 to 7. The semiconductor storage device 1 is a storage device such as a solid state drive (SSD). The semiconductor storage device 1 is attached to an information processing device such as a server device or a personal computer and is used as a storage region of the information processing device, for example. Hereinafter, the information processing device to which the semiconductor storage device 1 is to be attached will be referred to as a "host device."

FIG. 1 is a plan view showing the semiconductor storage device 1. The semiconductor storage device 1 includes, for example, a board 11, a terminal portion (i.e., connector) 12, a controller 13, a dynamic random access memory (DRAM) 14, a plurality of NAND-type flash memories 15 (hereinafter, referred to as "NANDs 15"), and a plurality of capacitors 16. However, the semiconductor storage device 1 is not limited to the above-described example. The semiconductor storage device 1 broadly corresponds to various semiconductor storage devices, may include a board of a size and shape other than those shown in the drawing and may not include a DRAM mounted thereon.

The board (e.g., wiring board, printed circuit board) 11 includes an insulator and a conductor pattern provided on the insulator. The conductor pattern includes a plurality of pads 51 and 52 to be described later (see FIG. 4). In addition, the board 11 includes a first surface 11a and a second surface 11b (see FIG. 6). The second surface 11b is positioned on a side opposite to the first surface 11a.

The terminal portion 12 includes, for example, a plurality of metal terminals (not shown) and is to be connected to a slot of the host device. The semiconductor storage device 1 receives power supplied from the host device through the terminal portion 12. The semiconductor storage device 1 receives various commands from the host device through the terminal portion 12 and performs writing, reading, erasing, and the like of data on the basis of the received commands.

The controller 13 is mounted on the first surface 11a of the board 11, for example. The controller 13 generally controls the overall semiconductor storage device 1. For example, the controller 13 is configured as a system on a chip (SoC) in which a host interface circuit for the host device, a control circuit for controlling the DRAM 14, a control circuit for controlling the plurality of NANDs 15, and the like are integrated into one semiconductor chip.

The DRAM 14 is mounted on the first surface 11a of the board 11, for example. The DRAM 14 is an example of a volatile semiconductor memory chip. The DRAM 14 functions as a data buffer in which write data received from the host device and read data read out from the NAND 15 are temporarily stored.

The plurality of NANDs 15 are mounted on at least one of the first surface 11a and the second surface 11b of the board 11. The NAND 15 is an example of a non-volatile semiconductor memory chip and is an example of a "semiconductor memory component." Note that the "semiconductor memory component" is not limited to the above-described example, and may be a magnetoresistive random access memory (MRAM), a resistive random access memory (ReRAM), or the like.

Here, a data write operation in the semiconductor storage device 1 will be described. In a case where data is written into the semiconductor storage device 1, the controller 13 temporarily stores write data received from the host device into the DRAM 14. Thereafter, the controller 13 stores the write data into the NANDs 15 by transmitting the write data stored in the DRAM 14 from the DRAM 14 to the NANDs 15. In the semiconductor storage device 1, an improvement in a writing speed is achieved by the above-described operation.

The plurality of capacitors 16 are mounted on at least one of the first surface 11a and the second surface 11b of the board 11. The capacitor 16 is, for example, a capacitor for power loss protection (PLP) and performs a power supply backup function for protecting data at a time of unexpected power shutdown. For example, in a case where the supply of power from the host device is unexpectedly shut off, the plurality of capacitors 16 supply power to the controller 13, the DRAM 14, and the NANDs 15, and the like until the write data temporarily stored in the DRAM 14 is read out from the DRAM 14 and the transmission of the write data to the NANDs 15 is completed.

In the present embodiment, the plurality of capacitors 16 are electrically connected to each other in parallel, so that capacitance required for the power supply backup function is secured. As an example of the capacitor 16, a conductive polymer aluminum electrolytic capacitor, a conductive polymer tantalum solid electrolytic capacitor, or the like is adopted. The plurality of capacitors 16 are disposed lined up in the Y direction.

Here, in the present embodiment, capacitors of one or more types selected from a plurality of types (for example, two types) of capacitor are mounted on the board 11 as the capacitors 16. The plurality of types of capacitor differ in, for example, at least one of the position, shape, and size of an electrode. Hereinafter, the details thereof will be described specifically.

Figure 2:
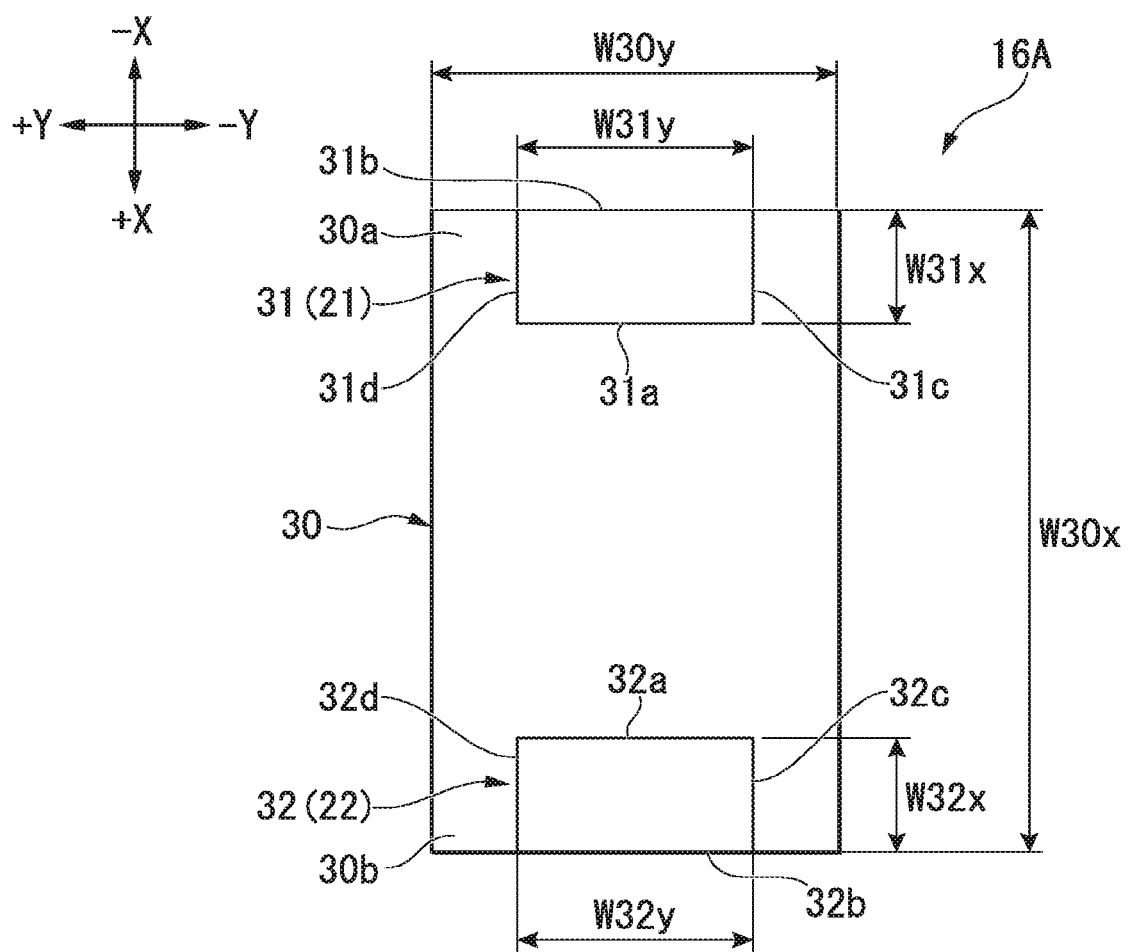
FIG. 2 is a bottom view showing a rear surface of a first capacitor according to the first embodiment.

FIG. 2 is a bottom view showing a rear surface of a first capacitor 16A. The first capacitor 16A is one of the plurality of types of capacitors. In FIG. 2, various directions (the X direction, the Y direction, and the like) are defined on the basis of a state where the first capacitor 16A is mounted on the board 11. The first capacitor 16A includes, for example, an exterior body 30, a positive electrode 31, and a negative electrode 32. The "positive electrode 31" and the "negative electrode 32" are examples of a "first electrode" and a "second electrode," respectively.

The exterior body 30 accommodates a material constituting the first capacitor 16A and forms the contour of the first capacitor 16A. The exterior body 30 is formed of an insulating material such as a resin or a ceramic. The exterior body 30 is formed in, for example, a substantially rectangular parallelepiped shape. The exterior body 30 includes a first end 30a and a second end 30b as ends of the exterior body 30 in the longitudinal direction (X direction). The exterior body 30 has a width W30x as a width in the X direction. The exterior body 30 has a width W30y as a width in the Y direction.

The positive electrode 31 is provided on the surface of the exterior body 30. At least a part of the positive electrode 31 is provided at the first end 30a of the exterior body 30. In FIG. 2, the shape of the positive electrode 31 is shown as a schematically quadrilateral shape. However, the shape of the positive electrode 31 is not limited to a quadrilateral shape, and may be a quadrilateral shape provided with a projection portion or a recess portion, or may be other polygonal shapes. In addition, at least a part of the outer shape of the positive electrode 31 may be formed in a curved shape. These modification examples are also the same for the negative electrode 32 of the first capacitor 16A and a positive electrode 41 and a negative electrode 42 of a second capacitor 16B.

The positive electrode 31 includes first to fourth edges (electrode edges) 31a, 31b, 31c, and 31d. The first edge 31a and the second edge 31b are separated from each other in the X direction and extend in the Y direction. The first edge 31a is an edge positioned closest to a +X direction side in the positive electrode 31. The second edge 31*b* is an edge positioned closest to a −X direction side in the positive electrode 31. For example, the first edge 31*a* and the second edge 31*b* linearly extend in the Y direction. "Linear" mentioned in the present specification means a linearly extending state in a macroscopic view and may be accompanied by microscopic irregularities, steps, or curves caused in manufacturing or by other reasons. In the example shown in FIG. 2, the first edge 31*a* and the second edge 31*b* are not provided over substantially the whole width of the exterior body 30 in the Y direction, but may be provided over substantially the whole width of the exterior body 30 in the Y direction. In addition, the first edge 31*a* and the second edge 31*b* are not required to be provided over substantially the whole width of the positive electrode 31 in the Y direction, but may be provided over substantially the whole width of the positive electrode 31 in the Y direction.

The third edge 31*c* and the fourth edge 31*d* are separated from each other in the Y direction and extend in the X direction. The third edge 31*c* is an edge positioned closest to a −Y direction side in the positive electrode 31. The fourth edge 31*d* is an edge positioned closest to a +Y direction side in the positive electrode 31. For example, the third edge 31*c* and the fourth edge 31*d* linearly extend in the X direction. Note that the third edge 31*c* and the fourth edge 31*d* are not required to be provided over substantially the whole width of the positive electrode 31 in the X direction, but may be provided over substantially the whole width of the positive electrode 31 in the X direction.

Here, various dimensions related to the positive electrode 31 are defined. The positive electrode 31 has a width W31*x* as a width in the X direction. The width W31*x* is a distance between the first edge 31*a* and the second edge 31*b*. The positive electrode 31 has a width W31*y* as a width in the Y direction. The width W31*y* is a distance between the third edge 31*c* and the fourth edge 31*d*.

Similarly, the negative electrode 32 is provided on the surface of the exterior body 30. At least a part of the negative electrode 32 is provided at the second end 30*b* of the exterior body 30.

The negative electrode 32 includes first to fourth edges (electrode edges) 32*a*, 32*b*, 32*c*, and 32*d*. The first edge 32*a* and the second edge 32*b* are separated from each other in the X direction and extend in the Y direction. The first edge 32*a* is an edge positioned closest to the −X direction side in the negative electrode 32. The second edge 32*b* is an edge positioned closest to the +X direction side in the negative electrode 32. For example, the first edge 32*a* and the second edge 32*b* linearly extend in the Y direction. Note that, in the example shown in FIG. 2, the first edge 32*a* and the second edge 32*b* are not provided over substantially the whole width of the exterior body 30 in the Y direction, but may be provided over substantially the whole width of the exterior body 30 in the Y direction. The first edge 32*a* and the second edge 32*b* are not required to be provided over substantially the whole width of the negative electrode 32 in the Y direction, but may be provided over substantially the whole width of the negative electrode 32 in the Y direction.

The third edge 32*c* and the fourth edge 32*d* are separated from each other in the Y direction and extend in the X direction. The third edge 32*c* is an edge positioned closest to the −Y direction side in the negative electrode 32. The fourth edge 32*d* is an edge positioned closest to the +Y direction side in the negative electrode 32. For example, the third edge 32*c* and the fourth edge 32*d* linearly extend in the X direction. Note that the third edge 32*c* and the fourth edge 32*d* are not required to be provided over substantially the whole width of the negative electrode 32 in the X direction, but may be provided over substantially the whole width of the negative electrode 32 in the X direction.

Here, various dimensions related to the negative electrode 32 are defined. The negative electrode 32 has a width W32*x* as a width in the X direction. The width W32*x* is a distance between the first edge 32*a* and the second edge 32*b*. The negative electrode 32 has a width W32*y* as a width in the Y direction. The width W32*y* is a distance between the third edge 32*c* and the fourth edge 32*d*. In the present embodiment, the positive electrode 31 and the negative electrode 32 have, for example, substantially the same size. That is, the width W32*x* of the negative electrode 32 in the X direction is substantially the same as the width W31*x* of the positive electrode 31 in the X direction. The width W32*y* of the negative electrode 32 in the Y direction is substantially the same as the width W31*y* of the positive electrode 31 in the Y direction.

Figure 3:
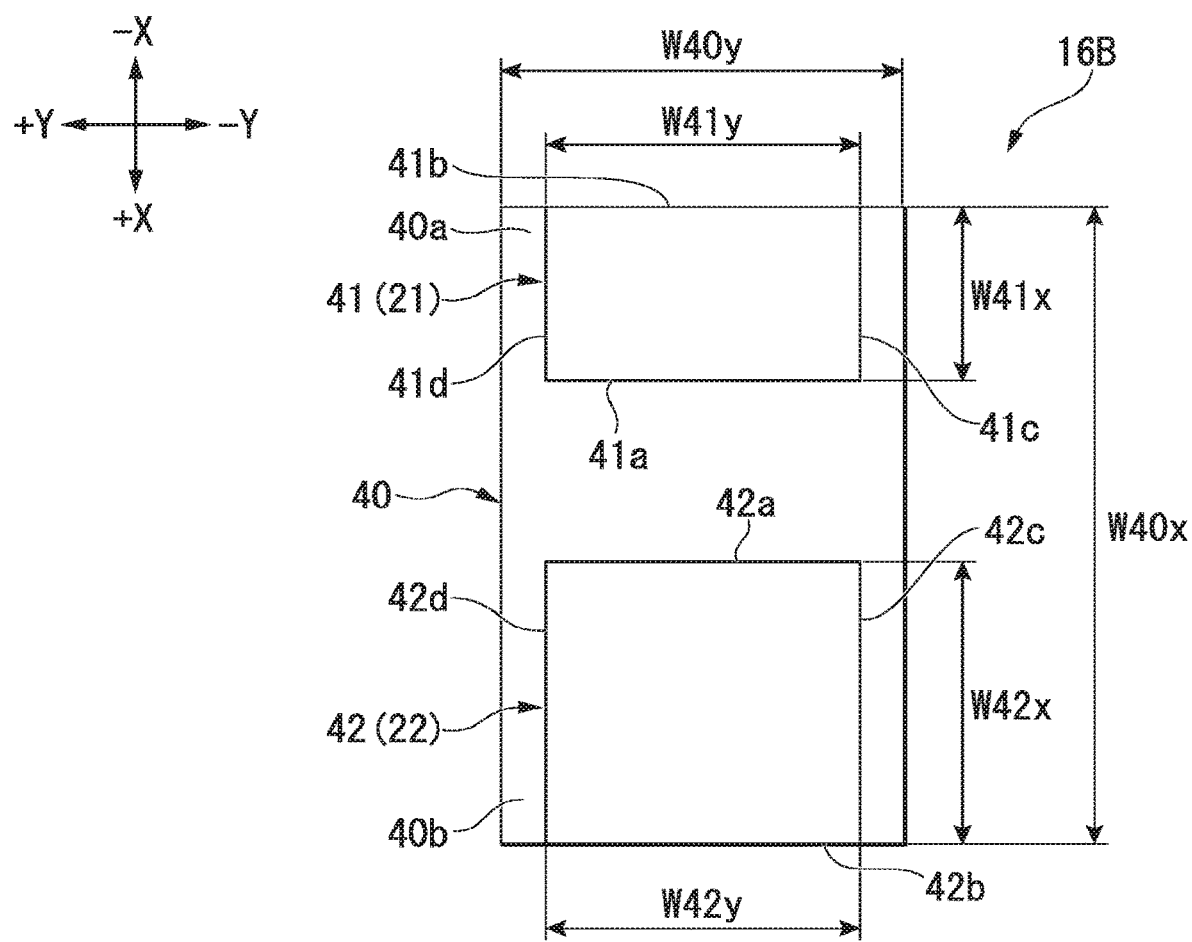
FIG. 3 is a bottom view showing a rear surface of a second capacitor according to the first embodiment.

FIG. 3 is a bottom view showing a rear surface of the second capacitor 16B. The second capacitor 16B is another one in the plurality of types of capacitors. In FIG. 3, various directions (the X direction, the Y direction, and the like) are defined on the basis of a state where the second capacitor 16B is mounted on the board 11. The second capacitor 16B includes, for example, an exterior body 40, a positive electrode 41, and a negative electrode 42. In a certain point of view, the "positive electrode 41" and the "negative electrode 42" are examples of a "third electrode" and a "fourth electrode," respectively. Further, in another point of view, the "positive electrode 41" and the "negative electrode 42" are examples of a "first electrode" and a "second electrode," respectively.

The exterior body 40 accommodates a material constituting the second capacitor 16B and forms the contour of the second capacitor 16B. The exterior body 40 is formed of an insulating material such as a resin or a ceramic. The exterior body 40 is formed in, for example, a substantially rectangular parallelepiped shape. The exterior body 40 includes a first end 40*a* and a second end 40*b* as ends of the exterior body 40 in the longitudinal direction (X direction). The exterior body 40 has a width W40*x* as a width in the X direction. The exterior body 40 has a width W40*y* as a width in the Y direction.

The positive electrode 41 is provided on the surface of the exterior body 40. At least a part of the positive electrode 41 is provided at the first end 40*a* of the exterior body 40.

The positive electrode 41 includes first to fourth edges (electrode edges) 41*a*, 41*b*, 41*c*, and 41*d*. The first edge 41*a* and the second edge 41*b* are separated from each other in the X direction and extend in the Y direction. The first edge 41*a* is an edge positioned closest to the +X direction side in the positive electrode 41. The second edge 41*b* is an edge positioned closest to the −X direction side in the positive electrode 41. For example, the first edge 41*a* and the second edge 41*b* linearly extend in the Y direction. Note that, in the example shown in FIG. 3, the first edge 41*a* and the second edge 41*b* are not provided over substantially the whole width of the exterior body 40 in the Y direction, but may be provided over substantially the whole width of the exterior body 40 in the Y direction. In addition, the first edge 41*a* and the second edge 41*b* are not required to be provided over substantially the whole width of the positive electrode 41 in the Y direction, but may be provided over substantially the whole width of the positive electrode 41 in the Y direction.

The third edge 41*c* and the fourth edge 41*d* are separated from each other in the Y direction and extend in the X direction. The third edge 41*c* is an edge positioned closest to the −Y direction side in the positive electrode 41. The fourth edge 41d is an edge positioned closest to the +Y direction side in the positive electrode 41. For example, the third edge 41c and the fourth edge 41d linearly extend in the X direction. Note that the third edge 41c and the fourth edge 41d are not required to be provided over substantially the whole width of the positive electrode 41 in the X direction, but may be provided over substantially the whole width of the positive electrode 41 in the X direction.

Here, various dimensions related to the positive electrode 41 are defined. The positive electrode 41 has a width W41x as a width in the X direction. The width W41x is a distance between the first edge 41a and the second edge 41b. The positive electrode 41 has a width W41y as a width in the Y direction. The width W41y is a distance between the third edge 41c and the fourth edge 41d.

Similarly, the negative electrode 42 is provided on the surface of the exterior body 40. At least a part of the negative electrode 42 is provided at the second end 40b of the exterior body 40.

The negative electrode 42 includes first to fourth edges (electrode edges) 42a, 42b, 42c, and 42d. The first edge 42a and the second edge 42b are separated from each other in the X direction and extend in the Y direction. The first edge 42a is an edge positioned closest to the −X direction side in the negative electrode 42. The second edge 42b is an edge positioned closest to the +X direction side in the negative electrode 42. For example, the first edge 42a and the second edge 42b linearly extend in the Y direction. Note that, in the example shown in FIG. 3, the first edge 42a and the second edge 42b are not provided over substantially the whole width of the exterior body 40 in the Y direction, but may be provided over substantially the whole width of the exterior body 40 in the Y direction. In addition, the first edge 42a and the second edge 42b are not required to be provided over substantially the whole width of the negative electrode 42 in the Y direction, but may be provided over substantially the whole width of the negative electrode 42 in the Y direction.

The third edge 42c and the fourth edge 42d are separated from each other in the Y direction and extend in the X direction. The third edge 42c is an edge positioned closest to the −Y direction side in the negative electrode 42. The fourth edge 42d is an edge positioned closest to the +Y direction side in the negative electrode 42. For example, the third edge 42c and the fourth edge 42d linearly extend in the X direction. Note that the third edge 42c and the fourth edge 42d are not required to be provided over substantially the whole width of the negative electrode 42 in the X direction, but may be provided over substantially the whole width of the negative electrode 42 in the X direction.

Here, various dimensions related to the negative electrode 42 are defined. The negative electrode 42 has a width W42x as a width in the X direction. The width W42x is a distance between the first edge 42a and the second edge 42b. The negative electrode 42 has a width W42y as a width in the Y direction. The width W42y is a distance between the third edge 42c and the fourth edge 42d. In the present embodiment, the negative electrode 42 has a size larger than that of the positive electrode 41. For example, the width W42x of the negative electrode 42 in the X direction is larger than the width W41x of the positive electrode 41 in the X direction. Note that, in the present embodiment, the width W42y of the negative electrode 42 in the Y direction is substantially the same as the width W41y of the positive electrode 41 in the Y direction.

Next, various dimensions of the first capacitor 16A and the second capacitor 16B will be compared with each other and described. In the present embodiment, the first capacitor 16A and the second capacitor 16B have, for example, substantially the same size. That is, the width W40x of the exterior body 40 of the second capacitor 16B in the X direction is substantially the same as the width W30x of the exterior body 30 of the first capacitor 16A in the X direction. The width W40y of the exterior body 40 of the second capacitor 16B in the Y direction is substantially the same as the width W30y of the exterior body 30 of the first capacitor 16A in the Y direction.

The positive electrode 41 of the second capacitor 16B has a size larger than that of the positive electrode 31 of the first capacitor 16A. For example, the width W41x of the positive electrode 41 of the second capacitor 16B in the X direction is larger than the width W31x of the positive electrode 31 of the first capacitor 16A in the X direction. The width W41y of the positive electrode 41 of the second capacitor 16B in the Y direction is larger than the width W31y of the positive electrode 31 of the first capacitor 16A in the Y direction.

The negative electrode 42 of the second capacitor 16B has a size larger than that of the negative electrode 32 of the first capacitor 16A. For example, the width W42x of the negative electrode 42 of the second capacitor 16B in the X direction is larger than the width W32x of the negative electrode 32 of the first capacitor 16A in the X direction. The width W42y of the negative electrode 42 of the second capacitor 16B in the Y direction is larger than the width W32y of the negative electrode 32 of the first capacitor 16A in the Y direction.

Next, the pads 51 and 52 (may be referred to as common pads) provided on the surface of the board 11 will be described. The pads 51 and 52 have shapes adaptable to both the first capacitor 16A and the second capacitor 16B. In the following description, the first capacitor 16A and the second capacitor 16B will be referred to as the capacitors 16 in a case where the capacitors 16A and 16B are not distinguished from each other. In addition, the positive electrode 31 of the first capacitor 16A and the positive electrode 41 of the second capacitor 16B will be referred to as the positive electrodes 21 in a case where the positive electrodes 31 and 41 are not distinguished from each other. The negative electrode 32 of the first capacitor 16A and the negative electrode 42 of the second capacitor 16B will be referred to as the negative electrodes 22 in a case where the negative electrodes 32 and 42 are not distinguished from each other.

Figure 4:
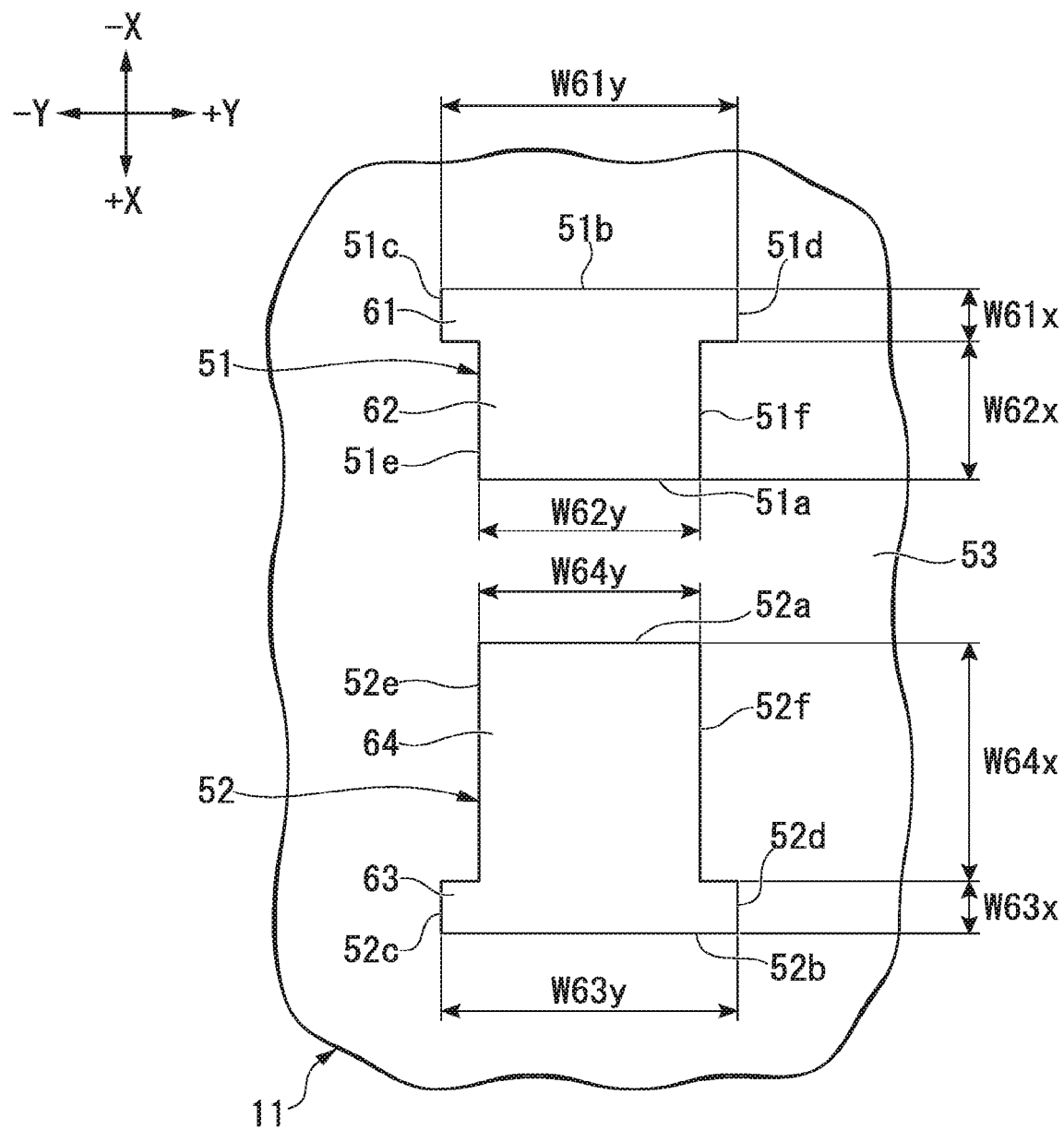
FIG. 4 is a plan view showing pads provided on a board according to the first embodiment.

FIG. 4 is a plan view showing a pair of pads 51 and 52 (the first pad 51 and the second pad 52) which are provided on the board 11. The pair of pads 51 and 52 are provided for each of the capacitors 16. The surface of the board 11 includes an insulating portion 53 at a position different from the pads 51 and 52. The insulating portion 53 surrounds the pads 51 and 52.

The pair of pads 51 and 52 are disposed so as to be separated from each other in the X direction. The first pad 51 is disposed corresponding to the positive electrode 21 of the capacitor 16 on the surface of the board 11, and the positive electrode 21 is fixed by solder S (see FIG. 6). On the other hand, the second pad 52 is disposed corresponding to the negative electrode 22 of the capacitor 16 on the surface of the board 11, and the negative electrode 22 is fixed by the solder S.

First, the first pad 51 will be described. The first pad 51 includes first to sixth edges (pad edges) 51a, 51b, 51c, 51d, 51e, and 51f. The first edge 51a and the second edge 51b are separated from each other in the X direction and extend in the Y direction. The first edge 51a is an edge positioned closest to the +X direction side in the first pad 51. The second edge 51b is an edge positioned closest to the −X direction side in the first pad 51. For example, the first edge 51a and the second edge 51b linearly extend in the Y direction.

The third edge 51c and the fourth edge 51d are separated from each other in the Y direction and extend in the X direction. For example, the third edge 51c and the fourth edge 51d linearly extend in the X direction. The third edge 51c and the fourth edge 51d are connected to the second edge 51b. The third edge 51c is an edge positioned closest to the −Y direction side in the first pad 51. The fourth edge 51d is an edge positioned closest to the +Y direction side in the first pad 51.

The fifth edge 51e and the sixth edge 51f are positioned on the +X direction side with respect to the third edge 51c and the fourth edge 51d. The fifth edge 51e and the sixth edge 51f are separated from each other in the Y direction and extend in the X direction. For example, the fifth edge 51e and the sixth edge 51f linearly extend in the X direction. The fifth edge 51e and the sixth edge 51f are connected to the first edge 51a. The fifth edge 51e is an edge positioned on the −Y direction side in the first pad 51. The sixth edge 51f is an edge positioned on the +Y direction in the in the first pad 51.

In the present embodiment, the first pad 51 is formed in a projection shape projecting toward the second pad 52. In detail, the first pad 51 includes a first region 61 and a second region 62 positioned on the second pad 52 side with respect to the first region 61. That is, the second region 62 is closer to the second pad 52 than the first region 61. The first region 61 is a region defined between the third edge 51c and the fourth edge 51d. The second region 62 is a region defined between the fifth edge 51e and the sixth edge 51f. A width W62y of the second region 62 in the Y direction (that is, a distance between the fifth edge 51e and the sixth edge 51f) is smaller than a width W61y of the first region 61 in the Y direction (that is, a distance between the third edge 51c and the fourth edge 51d). On the other hand, a width W62x of the second region 62 in the X direction is larger than a width W61x of the first region 61 in the X direction.

Next, the second pad 52 will be described. The second pad 52 includes first to sixth edges (pad edges) 52a, 52b, 52c, 52d, 52e, and 52f. The first edge 52a and the second edge 52b are separated from each other in the X direction and extend in the Y direction. The first edge 52a is an edge positioned closest to the −X direction side in the second pad 52. The second edge 52b is an edge positioned closest to the +X direction side in the second pad 52. For example, the first edge 52a and the second edge 52b linearly extend in the Y direction.

The third edge 52c and the fourth edge 52d are separated from each other in the Y direction and extend in the X direction. For example, the third edge 52c and the fourth edge 52d linearly extend in the X direction. The third edge 52c and the fourth edge 52d are connected to the second edge 52b. The third edge 52c is an edge positioned closest to the −Y direction side in the second pad 52. The fourth edge 52d is an edge positioned closest to the +Y direction side in the second pad 52.

The fifth edge 52e and the sixth edge 52f are positioned on the −X direction side with respect to the third edge 52c and the fourth edge 52d. The fifth edge 52e and the sixth edge 52f are separated from each other in the Y direction and extend in the X direction. For example, the fifth edge 52e and the sixth edge 52f linearly extend in the X direction. The fifth edge 52e and the sixth edge 52f are connected to the first edge 52a. The fifth edge 52e is an edge positioned on the −Y direction side in the second pad 52. The sixth edge 52f is an edge positioned on the +Y direction side in the second pad 52.

In the present embodiment, the second pad 52 is formed in a projection shape projecting toward the first pad 51. In detail, the second pad 52 includes a third region 63 and a fourth region 64 positioned on the first pad 51 side with respect to the third region 63. That is, the fourth region 64 is closer to the first pad 51 than the third region 63. The third region 63 is a region defined between the third edge 52c and the fourth edge 52d. The fourth region 64 is a region defined between the fifth edge 52e and the sixth edge 52f. In addition, a width W64y of the fourth region 64 in the Y direction (that is, a distance between the fifth edge 52e and the sixth edge 52f) is smaller than a width W63y of the third region 63 in the Y direction (that is, a distance between the third edge 52c and the fourth edge 52d). On the other hand, a width W64x of the fourth region 64 in the X direction is larger than a width W63x of the third region 63 in the X direction.

Figure 5:
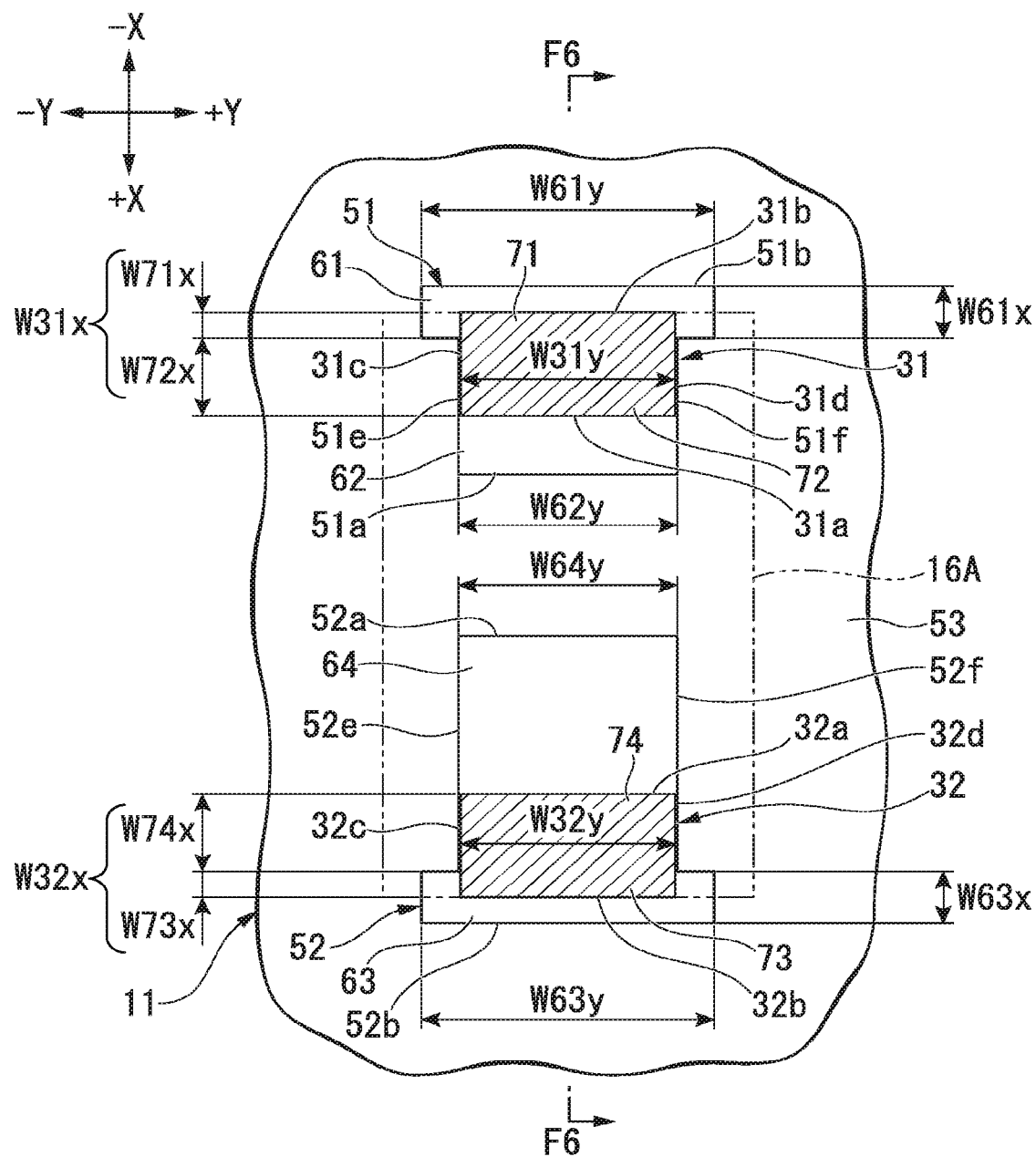
FIG. 5 is a cross-sectional view showing a relationship between pads and the first capacitor according to the first embodiment.

Next, a relationship between the first capacitor 16A and the pads 51 and 52 will be described. FIG. 5 is a cross-sectional view showing a relationship between the first capacitor 16A and the pads 51 and 52. Note that, in FIG. 5, only the positive electrode 31 and the negative electrode 32 are illustrated for the first capacitor 16A. Further, in FIG. 5, the solder S is not shown. FIGS. 7 to 12 are shown in a similar manner.

First, a relationship between the first pad 51 and the positive electrode 31 of the first capacitor 16A will be described.

The width W61y of the first region 61 of the first pad 51 in the Y direction is larger than the width W31y of the positive electrode 31 in the Y direction. On the other hand, the width W62y of the second region 62 of the first pad 51 in the Y direction is substantially the same as the width W31y of the positive electrode 31 in the Y direction. In other words, a difference between the dimension (width W62y) of the second region 62 of the first pad 51 in the Y direction and the dimension (width W31y) of the positive electrode 31 in the Y direction is smaller than a difference between the dimension (width W61y) of the first region 61 of the first pad 51 in the Y direction and the dimension (width W31y) of the positive electrode 31 in the Y direction. For example, portions of the fifth edge 51e and the sixth edge 51f of the first pad 51 are positioned in the vicinity of the respective third edge 31c and the fourth edge 31d of the positive electrode 31 and extend substantially in parallel with the third edge 31c and the fourth edge 31d of the positive electrode 31.

In the present embodiment, the width W61x of the first region 61 in the X direction is smaller than the width W31x of the positive electrode 31 in the X direction. The positive electrode 31 is disposed over at least a part of the first region 61 and at least a part of the second region 62. That is, the positive electrode 31 is fixed to at least a part of the first region 61 and at least a part of the second region 62 using the solder S. For example, the width W61x of the first region 61 in the X direction is ½ or less of the width W31x of the positive electrode 31 in the X direction.

In more detail, the positive electrode 31 includes a first portion 71 overlapping the first region 61 in the thickness direction of the board 11 and a second portion 72 overlapping the second region 62 in the thickness direction of the board 11. In the present embodiment, a width W72x of the second portion 72 in the X direction is larger than a width W71x of the first portion 71 in the X direction. In other words, half or more of each of the third edge 31c and the fourth edge 31d of the positive electrode 31 is along each of the respective fifth edge 51e and the sixth edge 51f of the first pad 51.

Next, a relationship between the second pad 52 and the negative electrode 32 of the first capacitor 16A will be described.

The width W63y of the third region 63 of the second pad 52 in the Y direction is larger than the width W32y of the negative electrode 32 in the Y direction. On the other hand, the width W64y of the fourth region 64 of the second pad 52 in the Y direction is substantially the same as the width W32y of the negative electrode 32 in the Y direction. In other words, a difference between the dimension (width W64y) of the fourth region 64 of the second pad 52 in the Y direction and the dimension (width W32y) of the negative electrode 32 in the Y direction is smaller than a difference between the dimension (width W63y) of the third region 63 of the second pad 52 in the Y direction and the dimension (width W32y) of the negative electrode 32 in the Y direction. For example, portions of the fifth edge 52e and the sixth edge 52f of the second pad 52 are positioned in the vicinity of the respective third edge 32c and fourth edge 32d of the negative electrode 32 and extend substantially in parallel with the third edge 32c and the fourth edge 32d of the negative electrode 32.

In the present embodiment, the width W63x of the third region 63 in the X direction is smaller than the width W32x of the negative electrode 32 in the X direction. The negative electrode 32 is disposed over at least a part of the third region 63 and at least a part of the fourth region 64. That is, the negative electrode 32 is fixed to at least a part of the third region 63 and at least a part of the fourth region 64 using the solder S. For example, the width W63x of the third region 63 in the X direction is ½ or less of the width W32x of the negative electrode 32 in the X direction.

In more detail, the negative electrode 32 includes a third portion 73 overlapping the third region 63 in the thickness direction of the board 11 and a fourth portion 74 overlapping the fourth region 64 in the thickness direction of the board 11. In the present embodiment, a width W74x of the fourth portion 74 in the X direction is larger than a width W73x of the third portion 73 in the X direction. In other words, half or more of each of the third edge 32c and the fourth edge 32d of the negative electrode 32 is along each of the respective fifth edge 52e and sixth edge 52f of the second pad 52.

Figure 6:
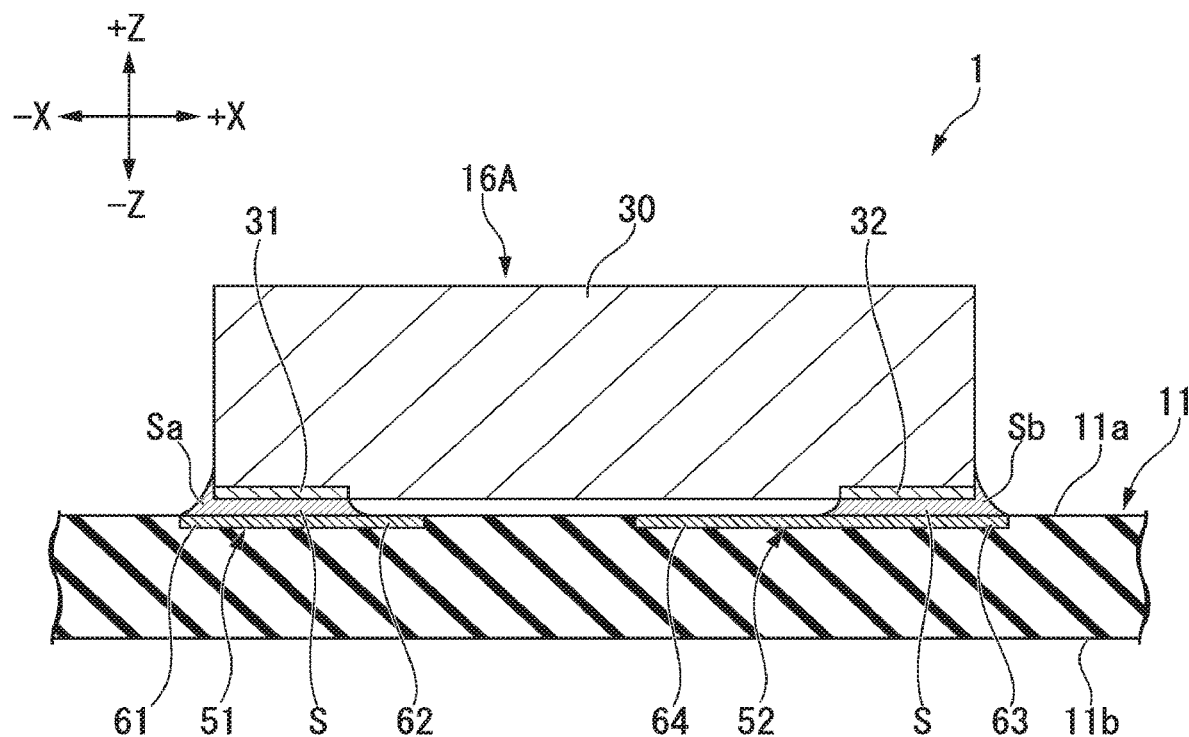
FIG. 6 is a cross-sectional view taken along a line F6-F6 of the semiconductor storage device shown in FIG. 5.

FIG. 6 is a cross-sectional view taken along line F6-F6 of the semiconductor storage device 1 shown in FIG. 5. In the present embodiment, a first fillet Sa of the solder S is formed in the first region 61 of the first pad 51. The first fillet Sa is formed to be closer to a region on the −X direction side than the positive electrode 31 in the first region 61 and is in contact with a side surface of the first capacitor 16A on the −X direction side. On the other hand, a second fillet Sb of the solder S is formed in the third region 63 of the second pad 52. The second fillet Sb is formed to be closer to a region on the +X direction side than the negative electrode 32 in the third region 63 and is in contact with a side surface of the first capacitor 16A on the +X direction side.

Figure 7:
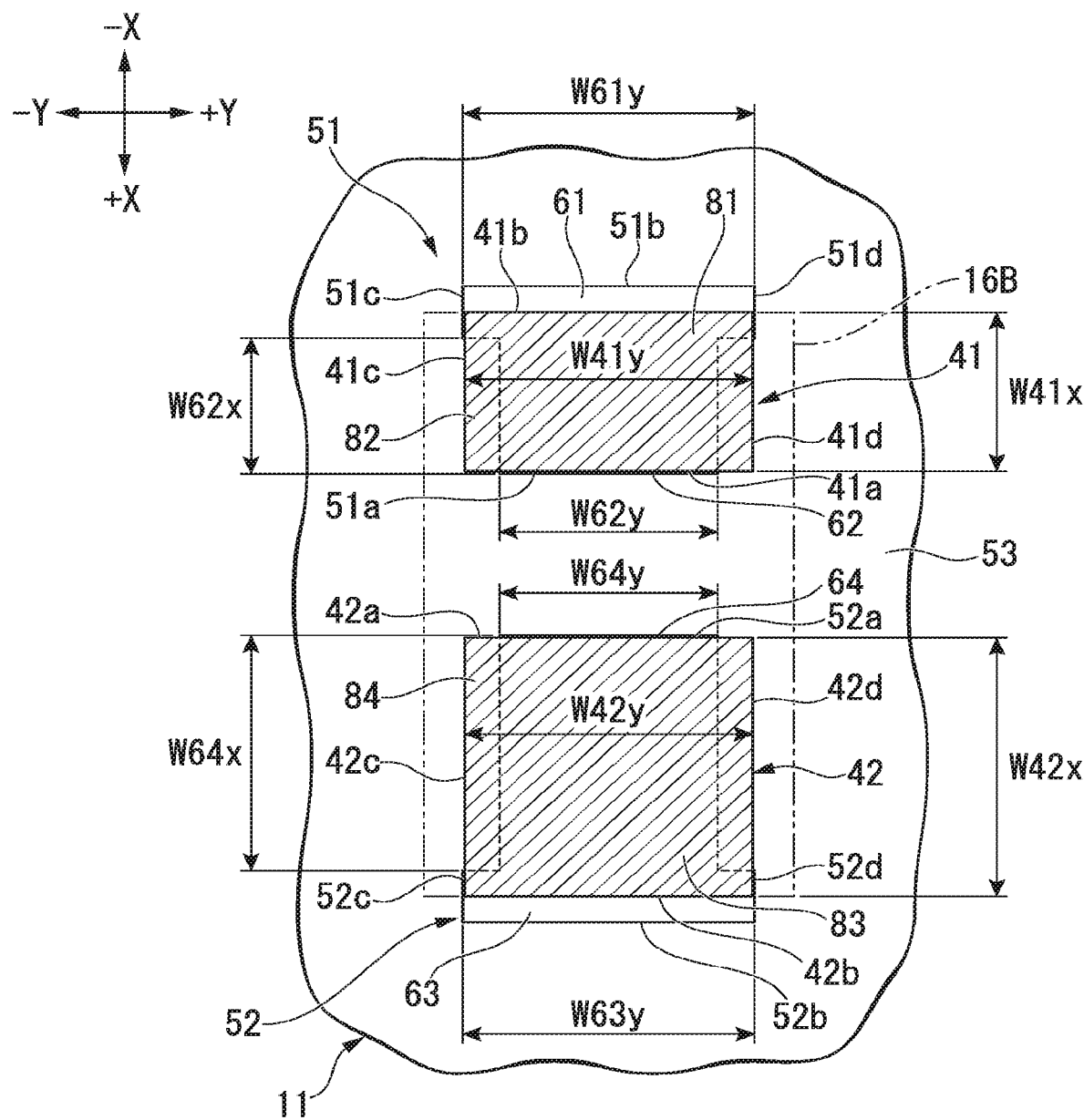
FIG. 7 is a cross-sectional view showing a relationship between pads and the second capacitor according to the first embodiment.

Next, a relationship between the second capacitor 16B and the pads 51 and 52 will be described. FIG. 7 is a cross-sectional view showing a relationship between the second capacitor 16B and the pads 51 and 52.

First, a relationship between the first pad 51 and the positive electrode 41 of the second capacitor 16B will be described.

The width W61y of the first region 61 of the first pad 51 in the Y direction is substantially the same as the width W41y of the positive electrode 41 in the Y direction. In other words, a difference between the dimension (width W61y) of the first region 61 of the first pad 51 in the Y direction and the dimension (width W41y) of the positive electrode 41 in the Y direction is smaller than a difference between the dimension (width W62y) of the second region 62 of the first pad 51 in the Y direction and the dimension (width W41y) of the positive electrode 41 in the Y direction. For example, portions of the third edge 51c and the fourth edge 51d of the first pad 51 are positioned in the vicinity of the respective third edge 41c and fourth edge 41d of the positive electrode 41 and extend substantially in parallel with the third edge 41c and the fourth edge 41d of the positive electrode 41.

In the present embodiment, the width W62x of the second region 62 in the X direction is smaller than the width W41x of the positive electrode 41 in the X direction. The positive electrode 41 is disposed over at least a part of the first region 61 and at least a part of the second region 62. That is, the positive electrode 41 is fixed to at least a part of the first region 61 and at least a part of the second region 62 using the solder S.

On the other hand, the width W62y of the second region 62 of the first pad 51 in the Y direction is smaller than the width W41y of the positive electrode 41 in the Y direction. For this reason, a portion of the positive electrode 41 protrudes to the outside of the first pad 51 when seen in a plan view. That is, the positive electrode 41 includes a bonding portion 81 overlapping the first pad 51 in the thickness direction of the board 11 and a non-bonding portion 82 overlapping the insulating portion 53 in the thickness direction of the board 11.

Further, in the present embodiment, the first edge 51a of the first pad 51 is positioned in the vicinity of the first edge 41a of the positive electrode 41 and extends substantially in parallel with the first edge 41a of the positive electrode 41. In another point of view, a distance in the X direction between the first edge 51a of the first pad 51 and the first edge 41a of the positive electrode 41 is smaller than a distance in the X direction between the second edge 51b of the first pad 51 and the second edge 41b of the positive electrode 41.

Next, a relationship between the second pad 52 and the negative electrode 42 of the second capacitor 16B will be described.

The width W63y of the third region 63 of the second pad 52 in the Y direction is substantially the same as the width W42y of the negative electrode 42 in the Y direction. In other words, a difference between the dimension (width W63y) of the third region 63 of the second pad 52 in the Y direction and the dimension (width W42y) of the negative electrode 42 in the Y direction is smaller than a difference between the dimension (width W64y) of the fourth region 64 of the second pad 52 in the Y direction and the dimension (width W42y) of the negative electrode 42 in the Y direction. For example, portions of the third edge 52c and the fourth edge 52d of the second pad 52 are positioned in the vicinity of the respective third edge 42c and fourth edge 42d of the negative electrode 42 and extend substantially in parallel with the third edge 42c and fourth edge 42d of the negative electrode 42.

In the present embodiment, the width W64x of the fourth region 64 in the X direction is smaller than the width W42x of the negative electrode 42 in the X direction. The negative electrode 42 is disposed over at least a part of the third region 63 and at least a part of the fourth region 64. That is, the negative electrode 42 is fixed to at least a part of the third region 63 and at least a part of the fourth region 64 using the solder S.

On the other hand, the width W64y of the fourth region 64 of the second pad 52 in the Y direction is smaller than the width W42y of the negative electrode 42 in the Y direction. For this reason, a portion of the negative electrode 42 protrudes to the outside of the second pad 52 when seen in a plan view. That is, the negative electrode 42 includes a bonding portion 83 overlapping the second pad 52 in the thickness direction of the board 11 and a non-bonding portion 84 overlapping the insulating portion 53 in the thickness direction of the board 11.

Further, in the present embodiment, the first edge 52a of the second pad 52 is positioned in the vicinity of the first edge 42a of the negative electrode 42 and extends substantially in parallel with the first edge 42a of the negative electrode 42. In another point of view, a distance in the X direction between the first edge 52a of the second pad 52 and the first edge 42a of the negative electrode 42 is smaller than a distance in the X direction between the second edge 52b of the second pad 52 and the second edge 42b of the negative electrode 42.

In addition, also in a case where the second capacitor 16B is mounted, the first fillet Sa of the solder S is formed in the first region 61 of the first pad 51. The first fillet Sa is formed to be closer to a region on the −X direction side than the positive electrode 41 in the first region 61 and is in contact with a side surface of the second capacitor 16B on the −X direction side. On the other hand, the second fillet Sb of the solder S is formed in the third region 63 of the second pad 52. The second fillet Sb is formed to be closer to a region on the +X direction side than the negative electrode 42 in the third region 63 and is in contact with a side surface of the second capacitor 16B on the +X direction side.

According to such a configuration, it is possible to provide the semiconductor storage device 1 capable of achieving the suppression of positional deviations of both the first capacitor 16A and the second capacitor 16B. That is, in the present embodiment, the first pad 51 includes the first region 61 and the second region 62 which have different widths in the Y direction. The width W62y of the second region 62 in the Y direction corresponds to the width W31y of the positive electrode 31 of the first capacitor 16A in the Y direction. For this reason, in a case where the first capacitor 16A is mounted on the board 11, a self-alignment effect is generated by the second region 62, and thus it is possible to suppress a rotation (a positional deviation of an inclination) of the first capacitor 16A at the time of mounting. On the other hand, the width W61y of the first region 61 in the Y direction corresponds to the width W41y of the positive electrode 41 of the second capacitor 16B in the Y direction. For this reason, in a case where the second capacitor 16B is mounted on the board 11, a self-alignment effect is generated by the first region 61, and thus it is possible to suppress a rotation (a positional deviation of an inclination) of the second capacitor 16B at the time of mounting. Thereby, it is possible to mount a plurality of types of capacitors having different electrode shapes on the board 11 while suppressing positional deviations.

Incidentally, in a case where the first capacitor 16A and the second capacitor 16B have the above-described electrode shapes, it is also considered that the first region 61 having a large width in the Y direction is disposed on the center side of the capacitor 16 and the second region 62 having a small width in the Y direction is disposed on the outer side when seen from the center of the capacitor 16, instead of adopting the shape of the pad 51 which has been described so far. However, in the present embodiment, the second region 62 is disposed on the center side of the capacitor 16, and the first region 61 is disposed on the outer side when seen from the center of the capacitor 16. Further, in the present embodiment, the width W61x of the first region 61 in the X direction is smaller than the width W31x of the positive electrode 31 of the first capacitor 16A in the X direction. According to such a configuration, it is possible to make a restraining force due to the self-alignment effect act on a position close to the end 30a of the first capacitor 16A, make a restraining force due to the self-alignment effect act on a position close to the end 40a of the second capacitor 16B, and make a relatively large resisting torque (a restraining force due to a moment) act in a case where the first capacitor 16A and the second capacitor 16B are about to rotate. Thereby, it is possible to more reliably suppress positional deviations of the first capacitor 16A and the second capacitor 16B.

In the present embodiment, the positive electrode 31 of the first capacitor 16A includes the first portion 71 overlapping the first region 61 of the first pad 51 and the second portion 72 overlapping the second region 62 of the first pad 51. In addition, the width W72x of the second portion 72 in the X direction is larger than the width W71x of the first portion 71 in the X direction. According to such a configuration, it is possible to increase the self-alignment effect generated from the first pad 51 with respect to the first capacitor 16A and to more reliably suppress a positional deviation of the first capacitor 16A.

Further, in the present embodiment, the first pad 51 includes the first edge 51a positioned on the second pad 52 side in the X direction. The positive electrode 41 of the second capacitor 16B includes the first edge 41a positioned on the negative electrode 42 side in the X direction. In addition, the first edge 51a of the first pad 51 is positioned in the vicinity of the first edge 41a of the positive electrode 41. According to such a configuration, regarding the second capacitor 16B, it is also possible to generate a self-alignment effect at the first edge 51a of the first pad 51. Thereby, it is possible to more reliably suppress a positional deviation of the second capacitor 16B. Thereby, for example, even in a case where the width W61x of the first region 61 of the first pad 51 in the X direction is relatively small so that the width W72x of the second portion 72 of the first capacitor 16A in the X direction becomes larger than the width W71x of the first portion 71 in the X direction (see FIG. 5), it is possible to more reliably suppress a positional deviation of the second capacitor 16B. Thereby, it is possible to more reliably suppress positional deviations of both the first capacitor 16A and the second capacitor 16B.

(Second Embodiment)

Next, a second embodiment will be described. The present embodiment is different from the first embodiment in that a first pad 51 and a second pad 52 are formed asymmetrically with respect to a virtual center line along the X direction. Note that configurations other than configurations to be described below are the same as those of the first embodiment.

Figure 8:
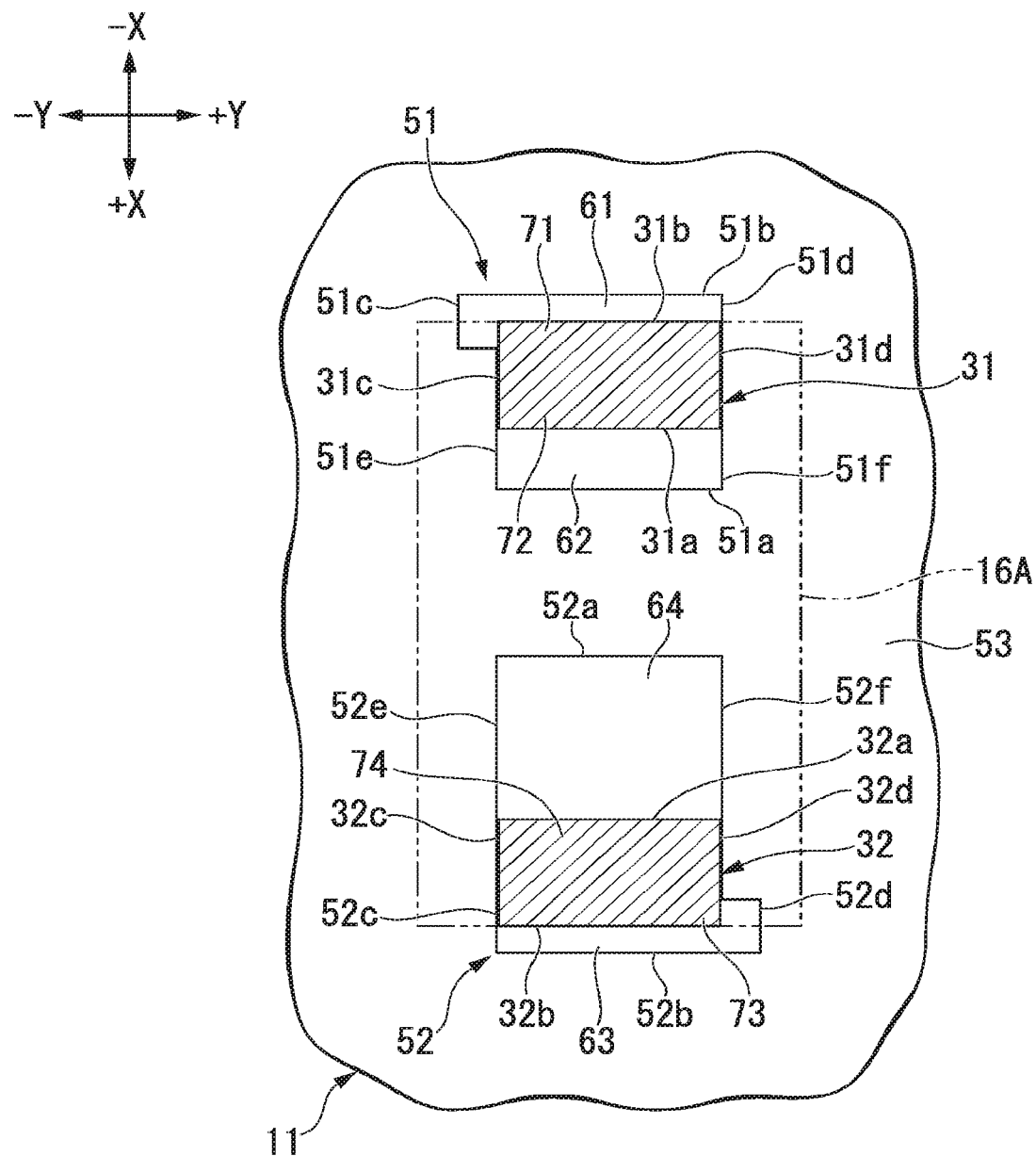
FIG. 8 is a cross-sectional view showing a relationship between pads and a first capacitor according to a second embodiment.

FIG. 8 is a cross-sectional view showing a relationship between a first capacitor 16A and the pads 51 and 52 of the present embodiment. In the present embodiment, the positions of a fourth edge 51d and a sixth edge 51f of the first pad 51 in the Y direction are substantially the same as each other. For example, the fourth edge 51d and the sixth edge 51f linearly extend in the X direction so as to be continuous with each other. For this reason, a first region 61 protrudes on only a −Y direction side with respect to a second region 62. In this case, a portion of a positive electrode 31 of the first capacitor 16A is also disposed along the fourth edge 51d of the first pad 51. Further, in the present embodiment, the positions of a third edge 52c and a fifth edge 52e of the second pad 52 in the Y direction are substantially the same as each other. For example, the third edge 52c and the fifth edge 52e linearly extend in the X direction so as to be continuous with each other. For this reason, the third region 63 protrudes on only a +Y direction side with respect to a fourth region 64. In this case, a portion of a negative electrode 32 of the first capacitor 16A is also disposed along the third edge 52c of the second pad 52. In the present embodiment, effects in a case where the first capacitor 16A is mounted are similar to those in the first embodiment.

Figure 9:
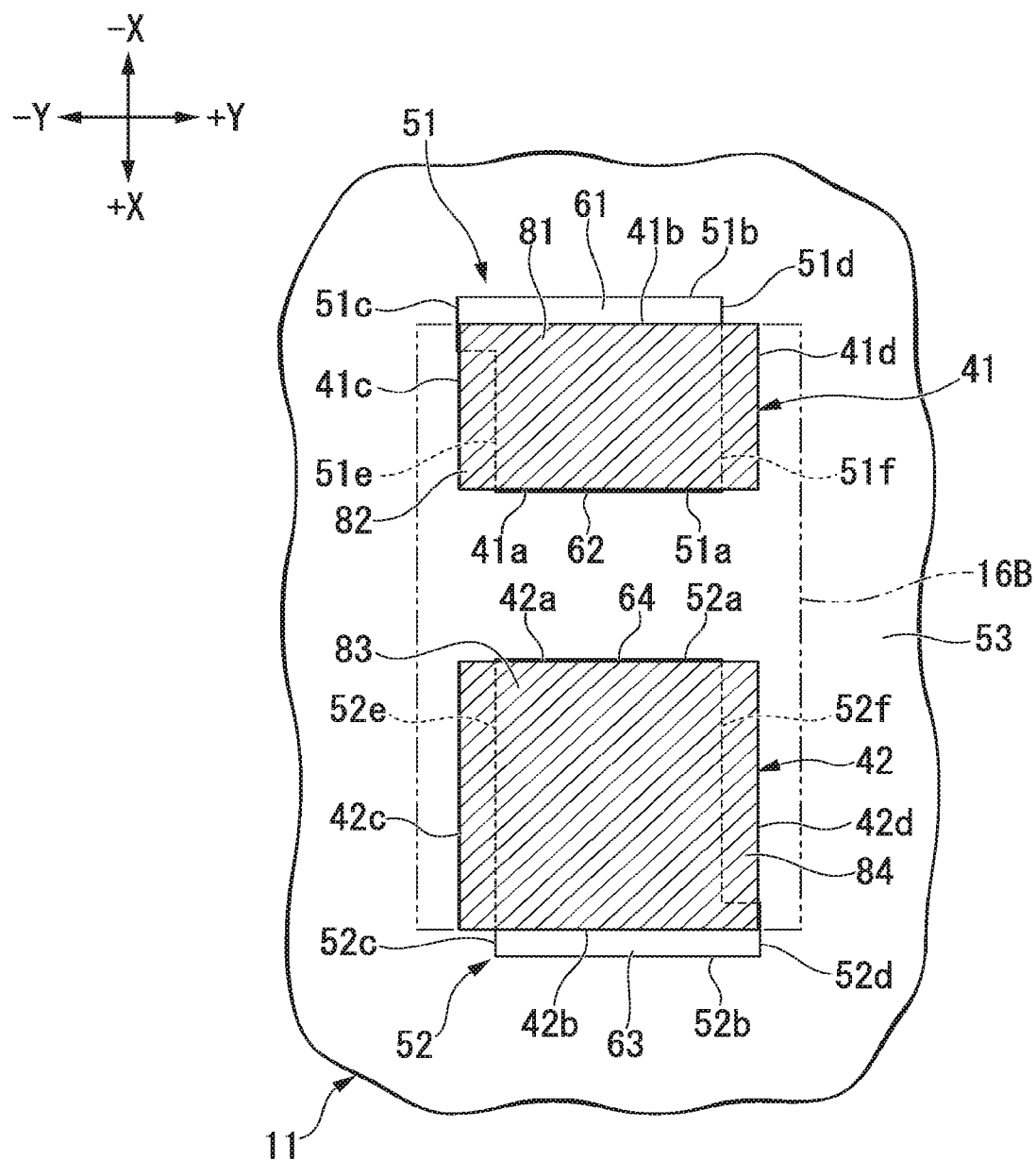
FIG. 9 is a cross-sectional view showing a relationship between pads and a second capacitor according to the second embodiment.

FIG. 9 is a cross-sectional view showing a relationship between a second capacitor 16B and the pads 51 and 52 of the present embodiment. As described above, the positions of the fourth edge 51d and the sixth edge 51f of the first pad 51 in the Y direction are substantially the same as each other. For this reason, in a case where the second capacitor 16B is mounted, the fourth edge 51d is not positioned in the vicinity of a fourth edge 41d of a positive electrode 41 of the second capacitor 16B. On the other hand, a third edge 51c of the first pad 51 is positioned in the vicinity of a third edge 41c of the positive electrode 41 of the second capacitor 16B and thus the self-alignment effect is generated.

Similarly, as described above, the positions of the third edge 52c and the fifth edge 52e of the second pad 52 in the Y direction are substantially the same as each other. For this reason, in a case where the second capacitor 16B is mounted, the third edge 52c of the second pad 52 is not positioned in the vicinity of a third edge 42c of a negative electrode 42 of the second capacitor 16B. On the other hand, a fourth edge 52d of the second pad 52 is positioned in the vicinity of a fourth edge 42d of the negative electrode 42 of the second capacitor 16B and thus the self-alignment effect is generated.

Even with such a configuration, it is possible to generate the self-alignment effect also in a case where either the first capacitor 16A or the second capacitor 16B is mounted and to mount a plurality of types of capacitors having different electrode shapes on a board 11 while suppressing positional deviations.

(Third Embodiment)

Next, a third embodiment will be described. The present embodiment is different from the first embodiment in that a second region 62 is disposed on an opposite side to a second pad 52 with respect to a first region 61 and a fourth region 64 is disposed on an opposite side to a first pad 51 with respect to a third region 63. Note that configurations other than configurations to be described below are the same as those of the first embodiment.

Figure 10:
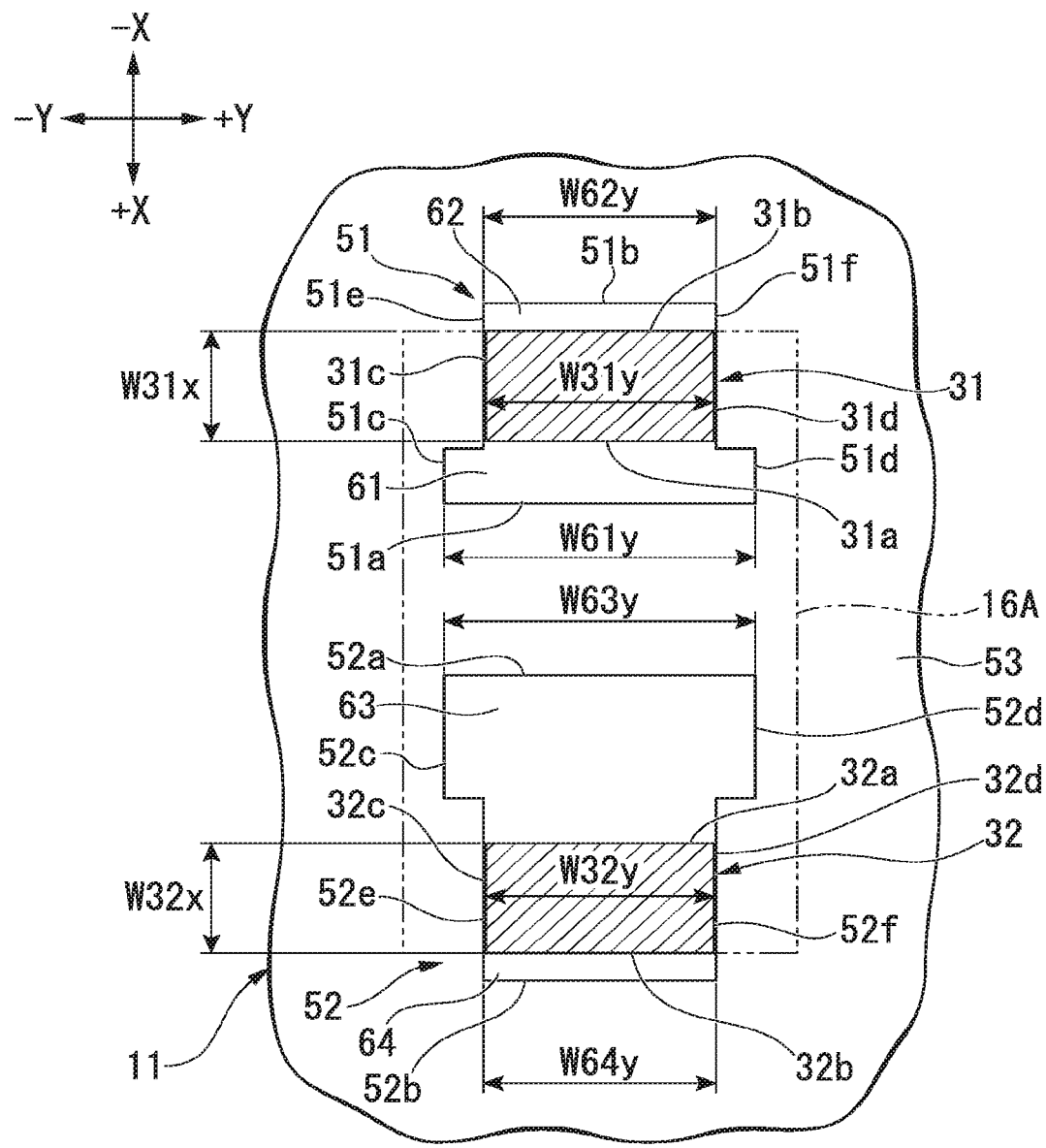
FIG. 10 is a cross-sectional view showing a relationship between pads and a first capacitor according to a third embodiment.

First, a relationship between a first capacitor 16A and the pads 51 and 52 of the present embodiment will be described. FIG. 10 is a cross-sectional view showing a relationship between the first capacitor 16A and the pads 51 and 52.

The first pad 51 includes the first region 61 and the second region 62. The second region 62 is positioned on an opposite side to the second pad 52 with respect to the first region 61. A third edge 51c and a fourth edge 51d are connected to a first edge 51a. A fifth edge 51e and a sixth edge 51f are positioned on a −X direction side with respect to the third edge 51c and the fourth edge 51d. The fifth edge 51e and the sixth edge 51f are connected to a second edge 51b. A width W62y of the second region 62 in the Y direction (that is, a distance between the fifth edge 51e and the sixth edge 51f) is smaller than a width W61y of the first region 61 in the Y direction (that is, a distance between the third edge 51c and the fourth edge 51d).

The width W61y of the first region 61 of the first pad 51 in the Y direction is larger than a width W31y of a positive electrode 31 in the Y direction. On the other hand, the width W62y of the second region 62 of the first pad 51 in the Y direction is substantially the same as the width W31y of the positive electrode 31 in the Y direction. In other words, a difference between the dimension (width W62y) of the second region 62 of the first pad 51 in the Y direction and the dimension (width W31y) of the positive electrode 31 in the Y direction is smaller than a difference between the dimension (width W61y) of the first region 61 of the first pad 51 in the Y direction and the dimension (width W31y) of the positive electrode 31 in the Y direction. For example, the fifth edge 51e and the sixth edge 51f of the first pad 51 are positioned in the vicinity of third edge 31c and fourth edge 31d of the positive electrode 31, respectively, and extend substantially in parallel with the third edge 31c and the fourth edge 31d of the positive electrode 31.

The second pad 52 includes a third region 63 and a fourth region 64. The fourth region 64 is positioned on an opposite side to the first pad 51 with respect to the third region 63. A third edge 52c and a fourth edge 52d are connected to a first edge 52a. A fifth edge 52e and a sixth edge 52f are positioned on a +X direction side with respect to the third edge 52c and the fourth edge 52d. The fifth edge 52e and the sixth edge 52f are connected to a second edge 52b. A width W64y of the fourth region 64 in the Y direction (that is, a distance between the fifth edge 52e and the sixth edge 52f) is smaller than a width W63y of the third region 63 in the Y direction (that is, a distance between the third edge 52c and the fourth edge 52d).

The width W63y of the third region 63 of the second pad 52 in the Y direction is larger than the width W32y of the negative electrode 32 in the Y direction. On the other hand, the width W64y of the fourth region 64 of the second pad 52 in the Y direction is substantially the same as the width W32y of the negative electrode 32 in the Y direction. In other words, a difference between the dimension (width W64y) of the fourth region 64 of the second pad 52 in the Y direction and the dimension (width W32y) of the negative electrode 32 in the Y direction is smaller than a difference between the dimension (width W63y) of the third region 63 of the second pad 52 in the Y direction and the dimension (width W32y) of the negative electrode 32 in the Y direction. For example, the fifth edge 52e and the sixth edge 52f of the second pad 52 are positioned in the vicinity of third edge 32c and fourth edge 32d of the negative electrode 32, respectively, and extend substantially in parallel with the third edge 32c and the fourth edge 32d of the negative electrode 32.

Figure 11:
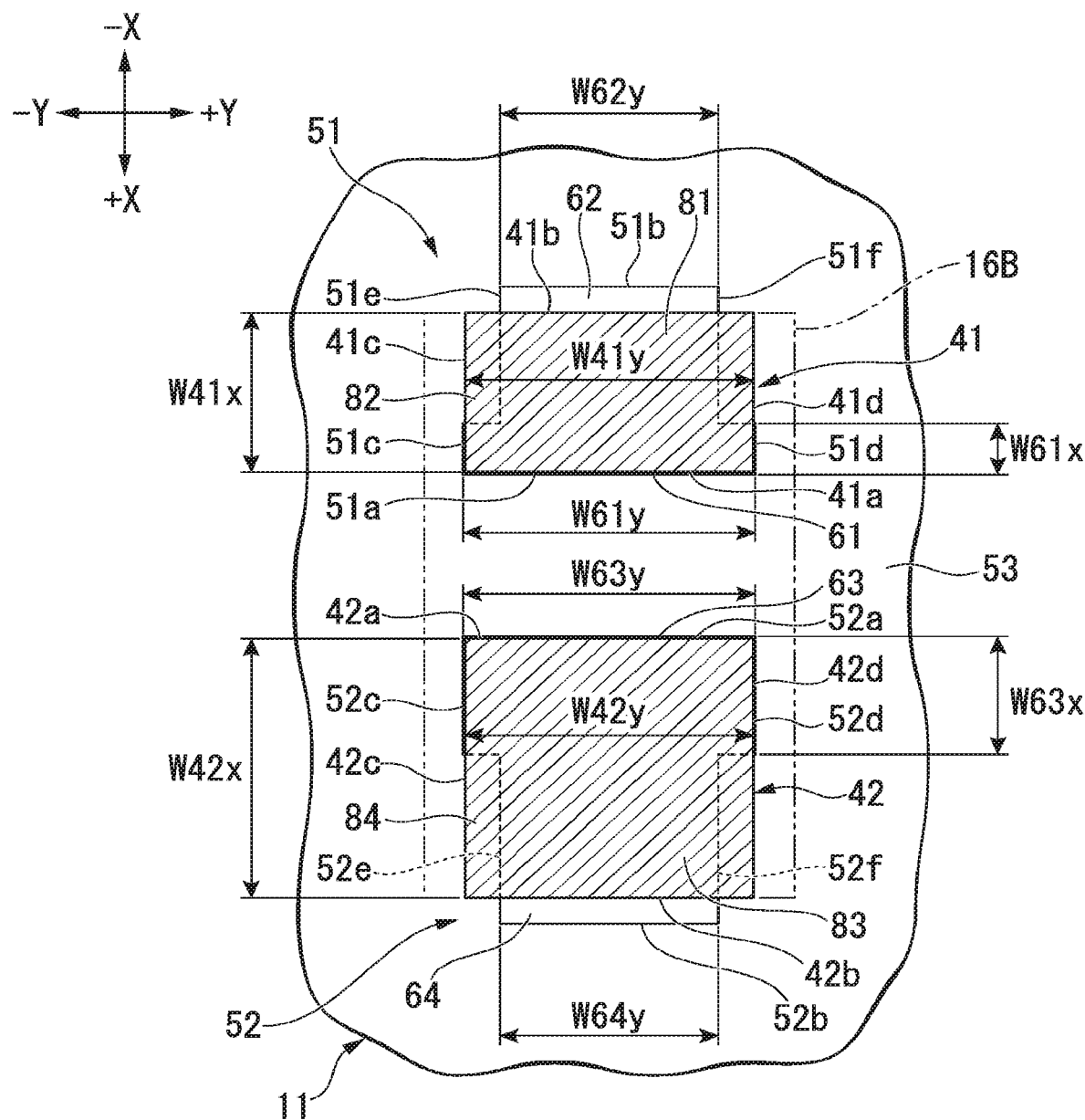
FIG. 11 is a cross-sectional view showing a relationship between pads and a second capacitor according to the third embodiment.

Next, a relationship between a second capacitor 16B and the pads 51 and 52 of the present embodiment will be described. FIG. 11 is a cross-sectional view showing a relationship between the second capacitor 16B and the pads 51 and 52.

The width W61y of the first region 61 of the first pad 51 in the Y direction is substantially the same as the width W41y of the positive electrode 41 in the Y direction. In other words, a difference between the dimension (width W61y) of the first region 61 of the first pad 51 in the Y direction and the dimension (width W41y) of the positive electrode 41 in the Y direction is smaller than a difference between the dimension (width W62y) of the second region 62 of the first pad 51 in the Y direction and the dimension (width W41y) of the positive electrode 41 in the Y direction. For example, the third edge 51c and the fourth edge 51d of the first pad 51 are positioned in the vicinity of third edge 41c and fourth edge 41d of the positive electrode 41, respectively, and extend substantially in parallel with the third edge 41c and the fourth edge 41d of the positive electrode 41.

In the present embodiment, a width W61x of the first region 61 in the X direction is smaller than a width W41x of the positive electrode 41 in the X direction. The positive electrode 41 is disposed over at least a part of the first region 61 and at least a part of the second region 62. That is, the positive electrode 41 is fixed to at least a part of the first region 61 and at least a part of the second region 62 using solder S.

On the other hand, the width W62y of the second region 62 of the first pad 51 in the Y direction is smaller than the width W41y of the positive electrode 41 in the Y direction. For this reason, a portion of the positive electrode 41 protrudes to the outside of the first pad 51 when seen in a plan view. That is, the positive electrode 41 includes a bonding portion 81 overlapping the first pad 51 in the thickness direction of a board 11 and a non-bonding portion 82 overlapping an insulating portion 53 in the thickness direction of the board 11.

Further, in the present embodiment, the first edge 51a of the first pad 51 is positioned in the vicinity of a first edge 41a of the positive electrode 41 and extends substantially in parallel with the first edge 41a of the positive electrode 41. In another point of view, a distance in the X direction between the first edge 51a of the first pad 51 and the first edge 41a of the positive electrode 41 is smaller than a distance in the X direction between the second edge 51b of the first pad 51 and a second edge 41b of the positive electrode 41.

Next, a relationship between the second pad 52 and a negative electrode 42 of the second capacitor 16B will be described.

The width W63y of the third region 63 of the second pad 52 in the Y direction is substantially the same as the width W42y of the negative electrode 42 in the Y direction. In other words, a difference between the dimension (width W63y) of the third region 63 of the second pad 52 in the Y direction and the dimension (width W42y) of the negative electrode 42 in the Y direction is smaller than a difference between the dimension (width W64y) of the fourth region 64 of the second pad 52 in the Y direction and the dimension (width W42y) of the negative electrode 42 in the Y direction. For example, the third edge 52c and the fourth edge 52d of the second pad 52 are positioned in the vicinity of third edge 42c and fourth edge 42d of the negative electrode 42, respectively, and extend substantially in parallel with the third edge 42c and the fourth edge 42d of the negative electrode 42.

In the present embodiment, the width W61x of the first region 61 in the X direction is smaller than a width W42x of the negative electrode 42 in the X direction. The negative electrode 42 is disposed over at least a part of the third region 63 and at least a part of the fourth region 64. That is, the negative electrode 42 is fixed to at least a part of the third region 63 and at least a part of the fourth region 64 using solder S.

On the other hand, the width W64y of the fourth region 64 of the second pad 52 in the Y direction is smaller than the width W42y of the negative electrode 42 in the Y direction. For this reason, a portion of the negative electrode 42 protrudes to the outside of the second pad 52 when seen in a plan view. That is, the negative electrode 42 includes a bonding portion 83 overlapping the second pad 52 in the thickness direction of the board 11 and a non-bonding portion 84 overlapping the insulating portion 53 in the thickness direction of the board 11.

Further, in the present embodiment, the first edge 52a of the second pad 52 is positioned in the vicinity of the first edge 42a of the negative electrode 42 and extends substantially in parallel with the first edge 42a of the negative electrode 42. In another point of view, a distance in the X direction between the first edge 52a of the second pad 52 and the first edge 42a of the negative electrode 42 is smaller than a distance in the X direction between the second edge 52b of the second pad 52 and the second edge 42b of the negative electrode 42.

According to such a configuration, it is possible to provide the semiconductor storage device 1 capable of achieving the suppression of positional deviations of both the first capacitor 16A and the second capacitor 16B. In the present embodiment, the first pad 51 includes the first region 61 and the second region 62 which have different widths in the Y direction. The width W62y of the second region 62 in the Y direction corresponds to the width W31y of the positive electrode 31 of the first capacitor 16A in the Y direction. For this reason, in a case where the first capacitor 16A is mounted on the board 11, a self-alignment effect is generated by the second region 62, and thus it is possible to suppress a rotation of the first capacitor 16A at the time of mounting. On the other hand, the width W61y of the first region 61 in the Y direction corresponds to the width W41y of the positive electrode 41 of the second capacitor 16B in the Y direction. For this reason, in a case where the second capacitor 16B is mounted on the board 11, a self-alignment effect is generated by the first region 61, and thus it is possible to suppress a rotation of the second capacitor 16B at the time of mounting. Thereby, it is possible to mount a plurality of types of capacitors having different electrode shapes on the board 11 while suppressing positional deviations.

In the present embodiment, the first region 61 is disposed on the center side of the capacitor 16, and the second region 62 is disposed on the outer side when seen from the center of the capacitor 16. Thereby, it is possible to make a restraining force due to a self-alignment effect act on a position close to an end 30a of the first capacitor 16A and make a relatively large resisting torque act in a case where the first capacitor 16A is about to rotate. Thereby, it is possible to more reliably suppress a positional deviation of the first capacitor 16A.

Further, in the present embodiment, the first edge 51a of the first pad 51 is positioned in the vicinity of the first edge 41a of the positive electrode 41. According to such a configuration, regarding the second capacitor 16B, it is also possible to generate a self-alignment effect at the first edge 51a of the first pad 51. Thereby, it is also possible to suppress a positional deviation of the second capacitor 16B. Thereby, it is possible to effectively achieve the suppression of positional deviations of both the first capacitor 16A and the second capacitor 16B.

(Modification Example of Third Embodiment)

Figure 12:
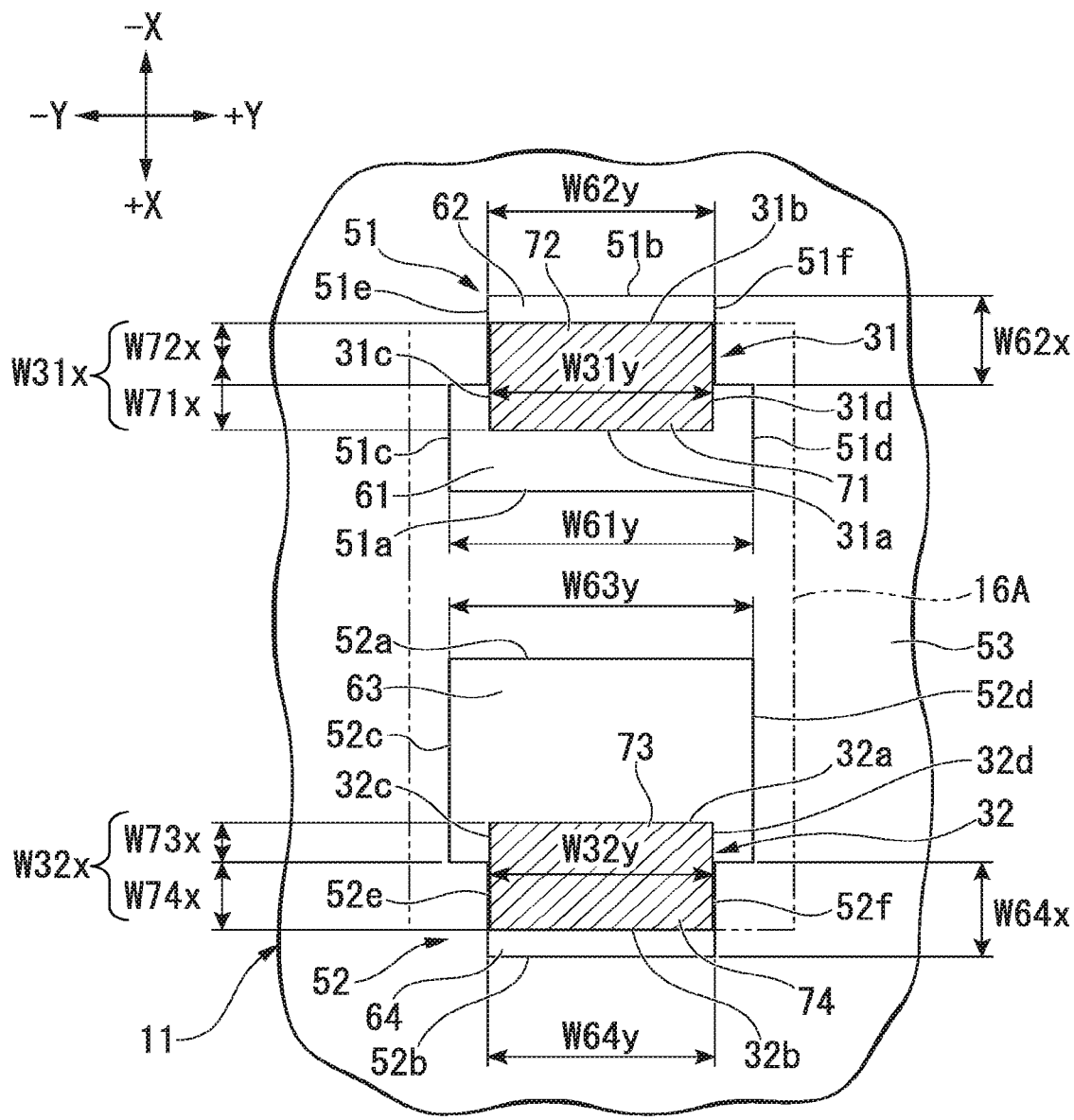
FIG. 12 is a cross-sectional view showing a relationship between pads and a first capacitor according to a modification example of the third embodiment.

Next, a modification example of the third embodiment will be described. Note that configurations other than configurations to be described below are the same as those of the third embodiment. FIG. 12 is a cross-sectional view showing a relationship between a first capacitor 16A and pads 51 and 52 of a first modification example. In the present modification example, a width W62x of a second region 62 of the first pad 51 in the X direction is smaller than a width W31x of a positive electrode 31 in the X direction. The positive electrode 31 is disposed over at least a part of a first region 61 and at least a part of the second region 62. That is, the positive electrode 31 is fixed to at least a part of the first region 61 and at least a part of the second region 62 using solder S.

In the present modification example, the positive electrode 31 includes a first portion 71 overlapping the first region 61 in the thickness direction of a board 11 and a second portion 72 overlapping the second region 62 in the thickness direction of the hoard 11. For example, a width W72x of the second portion 72 in the X direction is larger than a width W71x of the first portion 71 in the X direction. In other words, half or more of each of third edge 31c and fourth edge 31d of the positive electrode 31 is along each of respective fifth edge 51e and sixth edge 51f of a first pad 51.

Further in the present modification example, a width W64x of a fourth region 64 in the X direction is smaller than a width W32x of a negative electrode 32 in the X direction. The negative electrode 32 is disposed over at least a part of a third region 63 and at least a part of a fourth region 64. That is, the negative electrode 32 is fixed to at least a part of the third region 63 and at least a part of the fourth region 64 using the solder S.

In the present modification example, the negative electrode 32 includes a third portion 73 overlapping the third region 63 in the thickness direction of the board 11 and a fourth portion 74 overlapping the fourth region 64 in the thickness direction of the board 11. For example, a width W74x of the fourth portion 74 in the X direction is larger than a width W73x of the third portion 73 in the X direction. In other words, half or more of each of third edge 32c and fourth edge 32d of the negative electrode 32 is along each of fifth edge 52e and sixth edge 52f of the second pad 52.

According to such a configuration, it is also possible to make a restraining force due to a self-alignment effect act on a position close to an end 40a of the second capacitor 16B and make a relatively large resisting torque act in a case where the second capacitor 16B is about to rotate. Thereby, it is possible to more reliably suppress a positional deviation of the second capacitor 16B. Further, in the present modification example, regarding the first electrode 31, the width W72x of the second portion 72 in the X direction is larger than the width W71x of the first portion 71 in the X direction. According to such a configuration, it is possible to secure a relatively large self-alignment effect for the first capacitor 16A and it is also possible to more reliably suppress a positional deviation of the first capacitor 16A.

Note that the configuration in the modification example is not limited to the above-described example. For example, regarding the positive electrode 31, the width W72x of the second portion 72 in the X direction may also be smaller than the width W71x of the first portion 71 in the X direction. In addition, regarding the negative electrode 32, the width W74x of the fourth portion 74 in the X direction may be smaller than the width W73x of the third portion 73 in the X direction.

In addition, the configuration of the third embodiment may be realized in combination with the second embodiment. That is, in the configuration of the third embodiment, the first pad 51 and the second pad 52 may be formed asymmetrically with respect to a virtual center line along the X direction similar to the second embodiment.

According to at least one embodiment described above, a board includes a pad including a first region and a second region which have different widths, so that it is possible to achieve the suppression of a positional deviation of a capacitor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
a board including a first pad and a second pad;
a semiconductor memory component on the board; and
a first capacitor including a first electrode and a second electrode, the first electrode being fixed to the first pad, the second electrode being fixed to the second pad, wherein
the first pad includes a first region and a second region, the second region being closer to the second pad than the first region,
a direction from the first pad to the second pad is a first direction and a direction different from the first direction is a second direction,
a dimension of the second region in the second direction is smaller than a dimension of the first region in the second direction, and the first region and the second region are contiguous with one another,
a difference between the dimension of the second region in the second direction and a dimension of the first electrode in the second direction is smaller than a difference between the dimension of the first region in the second direction and the dimension of the first electrode in the second direction, and
the first electrode covers at least a part of the first region and at least a part of the second region when seen in a direction perpendicular to the board.

2. The semiconductor storage device according to claim 1, wherein
a dimension of the first region in the first direction is smaller than a dimension of the first electrode in the first direction.

3. The semiconductor storage device according to claim 1, wherein
the first electrode includes a first portion and a second portion, the first portion overlapping the first region in a thickness direction of the board, the second portion overlapping the second region in the thickness direction of the board, and
a dimension of the second portion in the first direction is larger than a dimension of the first portion in the first direction.

4. The semiconductor storage device according to claim 1, wherein
the second pad includes a third region and a fourth region, the fourth region being closer to the first pad than the third region,
a difference between a dimension of the fourth region in the second direction and a dimension of the second electrode in the second direction is smaller than a difference between a dimension of the third region in the second direction and the dimension of the second electrode in the second direction, and
the second electrode covers at least a part of the third region and at least a part of the fourth region when seen in the direction perpendicular to the board.

5. The semiconductor storage device according to claim 4, wherein
the second electrode includes a third portion and a fourth portion, the third portion overlapping the third region in a thickness direction of the board, the fourth portion overlapping the fourth region in the thickness direction of the board, and
a dimension of the fourth portion in the first direction is larger than a dimension of the third portion in the first direction.

6. The semiconductor storage device according to claim 1, wherein
an edge of the first region on a side in the second direction and an edge of the second region on the same side in the second direction are linearly continuous with each other.

7. A semiconductor storage device, comprising:
a board including a first pad and a second pad;
a semiconductor memory component on the board; and
a capacitor including a first electrode and a second electrode, the first electrode being fixed to the first pad, the second electrode being fixed to the second pad, wherein
the first pad includes a first region and a second region, the second region being closer to the second pad than the first region,
a direction from the first pad to the second pad is a first direction and a direction different from the first direction is a second direction,
a dimension of the second region in the second direction is smaller than a dimension of the first region in the second direction, and the first region and the second region are contiguous with one another,
a difference between the dimension of the first region in the second direction and a dimension of the first electrode in the second direction is smaller than a difference between the dimension of the second region in the second direction and the dimension of the first electrode in the second direction, and
the first electrode covers at least a part of the first region and at least a part of the second region when seen in a direction perpendicular to the board.

8. The semiconductor storage device according to claim 7, wherein
the first pad includes a first edge positioned on a second pad side in the first direction,
the first electrode includes a first edge positioned on a second electrode side in the first direction, and
the first edge of the first pad is positioned substantially coincident with the first edge of the first electrode.

9. The semiconductor storage device according to claim 7, wherein
the first pad includes a first edge and a second edge, the first edge of the first pad being positioned on a second pad side in the first direction, the second edge of the first pad being positioned on an opposite side to the first edge of the first pad in the first direction,
the first electrode includes a first edge and a second edge, the first edge of the first electrode being positioned on a second electrode side in the first direction, the second edge of the first electrode being positioned on an opposite side to the first edge of the first electrode in the first direction, and
a distance between the first edge of the first pad and the first edge of the first electrode in the first direction is smaller than a distance between the second edge of the first pad and the second edge of the first electrode in the first direction.

10. The semiconductor storage device according to claim 7, wherein
the board includes a surface, the surface including an insulating portion at a position different from the first pad and the second pad, and
the first electrode includes a portion overlapping the first pad in a thickness direction of the board and a portion overlapping the insulating portion in the thickness direction of the board.

11. The semiconductor storage device according to claim 7, wherein
the second pad includes a third region and a fourth region, the fourth region being closer to the first pad than the third region,
a difference between a dimension of the third region in the second direction and a dimension of the second electrode in the second direction is smaller than a difference between a dimension of the fourth region in the second direction and the dimension of the second electrode in the second direction, and
the second electrode covers at least a part of the third region and at least a part of the fourth region when seen in the direction perpendicular to the board.

12. The semiconductor storage device according to claim 7, wherein
an edge of the first region on a side in the second direction and an edge of the second region on the same side in the second direction are linearly continuous with each other.

* * * * *